(12) United States Patent
McLelland et al.

(10) Patent No.: US 11,989,645 B2
(45) Date of Patent: May 21, 2024

(54) EVENT-BASED EXTRACTION OF FEATURES IN A CONVOLUTIONAL SPIKING NEURAL NETWORK

(71) Applicant: BrainChip, Inc., Laguna Hills, CA (US)

(72) Inventors: Douglas McLelland, Gers (FR); Kristofor D. Carlson, Willoughby Hills, OH (US); Harshil K. Patel, Darch (AU); Anup A. Vanarse, Darch (AU); Milind Joshi, Edgewater (AU)

(73) Assignee: BrainChip, Inc., Laguna Hills, CA (US)

( * ) Notice: Subject to any disclaimer, the term of this patent is extended or adjusted under 35 U.S.C. 154(b) by 203 days.

(21) Appl. No.: 17/583,640

(22) Filed: Jan. 25, 2022

(65) Prior Publication Data

US 2022/0147797 A1 May 12, 2022

Related U.S. Application Data

(63) Continuation-in-part of application No. PCT/US2020/043456, filed on Jul. 24, 2020.
(Continued)

(51) Int. Cl.
*G06N 3/063* (2023.01)
*G06N 3/049* (2023.01)
(Continued)

(52) U.S. Cl.
CPC ............ *G06N 3/063* (2013.01); *G06N 3/049* (2013.01); *G06N 3/08* (2013.01); *G06T 3/4046* (2013.01); *G11C 11/41* (2013.01); *G11C 11/54* (2013.01)

(58) Field of Classification Search
CPC .......... G06N 3/063; G06N 3/049; G06N 3/08; G06N 3/045; G06N 3/088; G06T 3/4046;
(Continued)

(56) References Cited

U.S. PATENT DOCUMENTS

| 11,126,913 B2 | 9/2021 | Hunsberger et al. |
| 11,227,210 B2 | 1/2022 | van der Made et al. |

(Continued)

FOREIGN PATENT DOCUMENTS

WO   WO 2018/091706 A1   5/2018

OTHER PUBLICATIONS

International Search Report and Written Opinion mailed Apr. 28, 2022 for International Appl. No. PCT/US2022/014123, 13 pages.
(Continued)

*Primary Examiner* — Ajay Ojha
(74) *Attorney, Agent, or Firm* — Sterne, Kessler, Goldstein & Fox P.L.L.C.

(57) ABSTRACT

A system is described that comprises a memory for storing data representative of at least one kernel, a plurality of spiking neuron circuits, and an input module for receiving spikes related to digital data. Each spike is relevant to a spiking neuron circuit and each spike has an associated spatial coordinate corresponding to a location in an input spike array. The system also comprises a transformation module configured to transform a kernel to produce a transformed kernel having an increased resolution relative to the kernel, and/or transform the input spike array to produce a transformed input spike array having an increased resolution relative to the input spike array. The system also comprises a packet collection module configured to collect spikes until a predetermined number of spikes relevant to the input spike array have been collected in a packet in memory, and to organize the collected relevant spikes in the packet
(Continued)

based on the spatial coordinates of the spikes, and a convolutional neural processor configured to perform event-based convolution using memory and at least one of the transformed input spike array and the transformed kernel.

21 Claims, 27 Drawing Sheets

Related U.S. Application Data

(60) Provisional application No. 62/878,426, filed on Jul. 25, 2019.

(51) Int. Cl.
  *G06N 3/08* (2023.01)
  *G06T 3/40* (2006.01)
  *G06T 3/4046* (2024.01)
  *G11C 11/41* (2006.01)
  *G11C 11/54* (2006.01)

(58) Field of Classification Search
  CPC ....... G11C 11/41; G11C 11/54; G11C 7/1006; G11C 11/419; G06F 18/241
  See application file for complete search history.

(56) References Cited

U.S. PATENT DOCUMENTS

| | | |
|---|---|---|
| 2009/0287624 A1 | 11/2009 | Rouat et al. |
| 2010/0318487 A1 | 12/2010 | Marvasti |
| 2012/0259804 A1 | 10/2012 | Brezzo et al. |
| 2013/0151448 A1 | 6/2013 | Ponulak |
| 2013/0204814 A1 | 8/2013 | Hunzinger et al. |
| 2014/0081895 A1 | 3/2014 | Coenen et al. |
| 2016/0042271 A1 | 2/2016 | Yoon et al. |
| 2016/0086075 A1 | 3/2016 | Alvarez-Icaza Rivera et al. |
| 2017/0236051 A1 | 8/2017 | Van Der Made et al. |
| 2018/0174023 A1 | 6/2018 | Imam et al. |
| 2018/0225562 A1 | 8/2018 | Van Der Made |
| 2019/0156201 A1 | 5/2019 | Bichler et al. |
| 2021/0027152 A1 | 1/2021 | Van Der Made et al. |

OTHER PUBLICATIONS

Stromatias et al., "An Event-Driven Classifier for Spiking Neural Networks Fed with Synthetic or Dynamic Vision Sensor Data," Frontiers in Neuroscience 11 (2017): Article 350, Jun. 28, 2017; Retrieved on Mar. 26, 2022 from https://www.frontiersin.org; 17 pages.

European Supplementary Search Report, completed Jun. 28, 2022, for European Application No. EP 19 88 0608.5, 2 pages.

European Supplementary Search Report, completed Sep. 1, 2023, for European Application No. EP 20 84 3031.4, 5 pages.

Frenkel et al., "MorphIC: A 65-nm 738k-Synapse/mm$^2$ Quad-Core Binary-Weight Digital Neuromorphic Processor with Stochastic Spike-Driven Online Learning," arxiv.org, Cornell University Library, 201 Olin Library, Cornell University, Ithaca, NY 14853, Apr. 17, 2019 (Apr. 17, 2019), 12 pages.

International Search Report mailed Oct. 13, 2020 for Appl. No. PCT/US2020/043456, 3 pages.

Written Opinion mailed Oct. 13, 2020 for Appl. No. PCT/US2020/043456, 4 pages.

Hulata, Eyal et al., "A method for spike sorting and detection based on wavelet packets and Shannon's mutual information," Journal of Neuroscience Methods 117:1-12 (2002), 12 pages.

Kheradpisheh, Saced Reza et al., "STDP-based spiking deep convolutional neural networks for object recognition," Neural Networks (2017). https://doi.org/10.1016/j.neunet.2017.12.005, 21 pages.

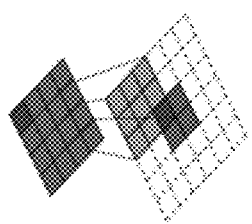
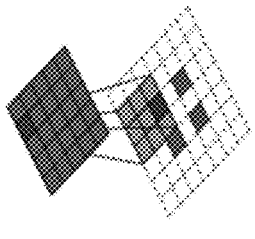
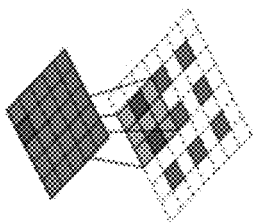
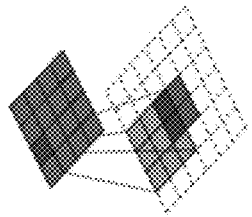
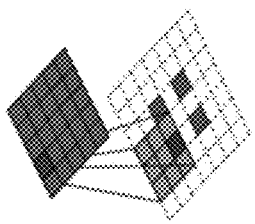
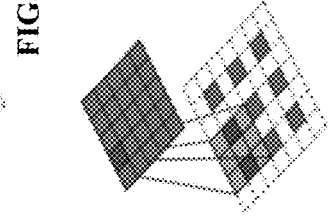
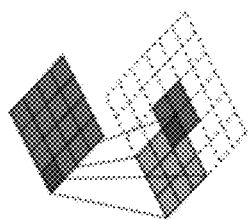
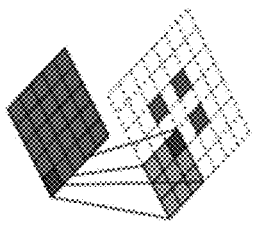
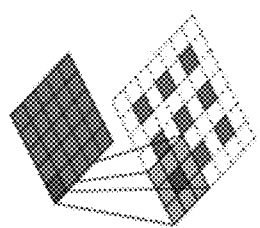
FIG. 22(i)  FIG. 22(ii)  FIG. 22(iii)

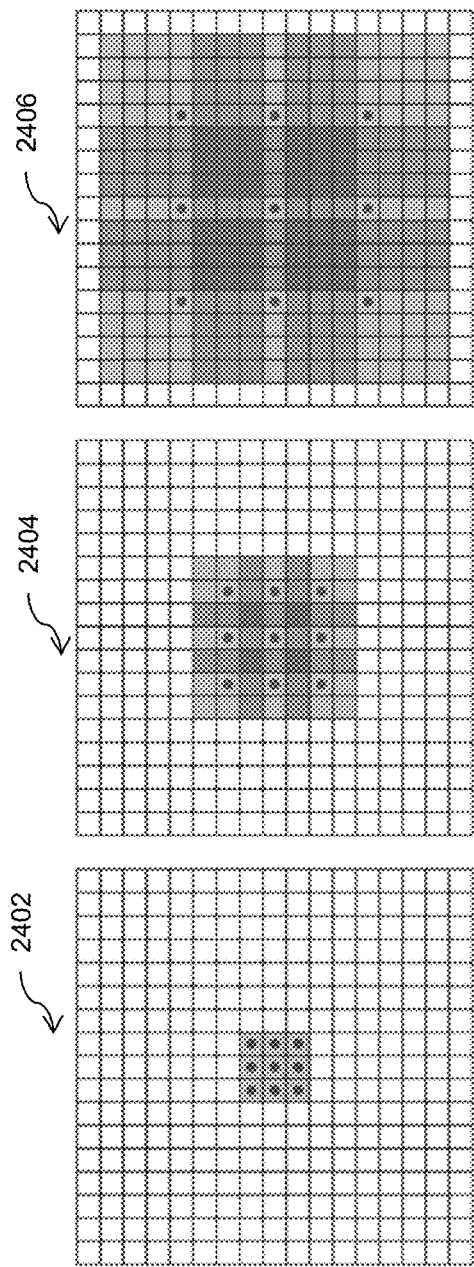
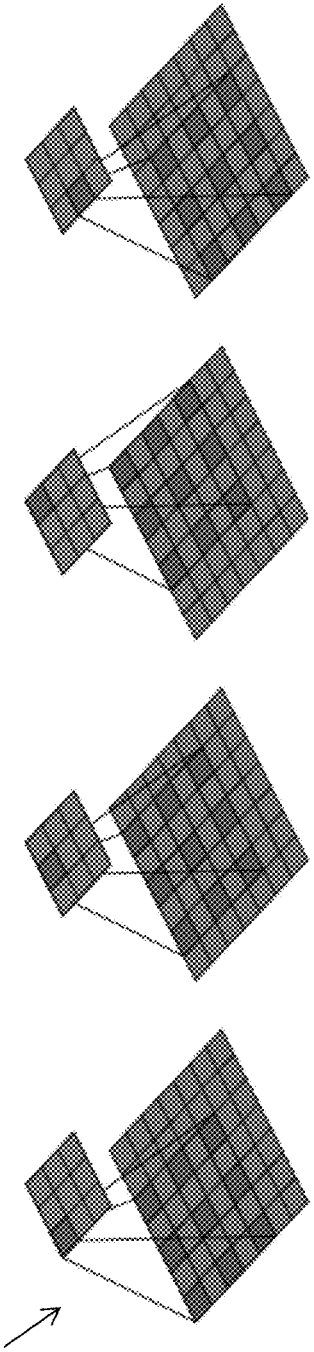
FIG. 24(i)
FIG. 24(ii)

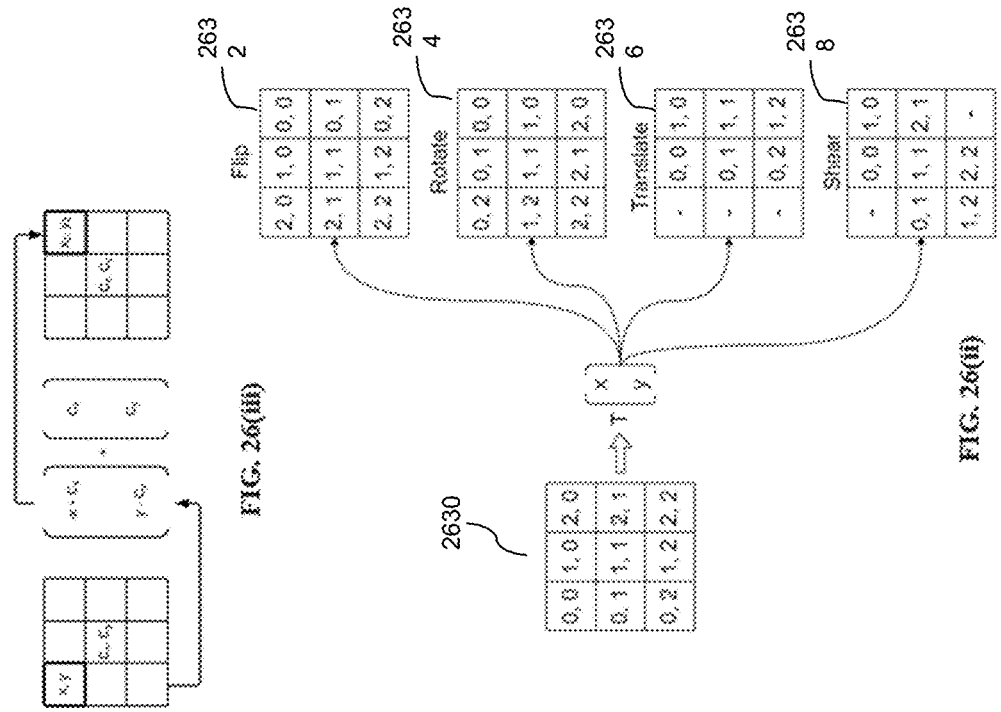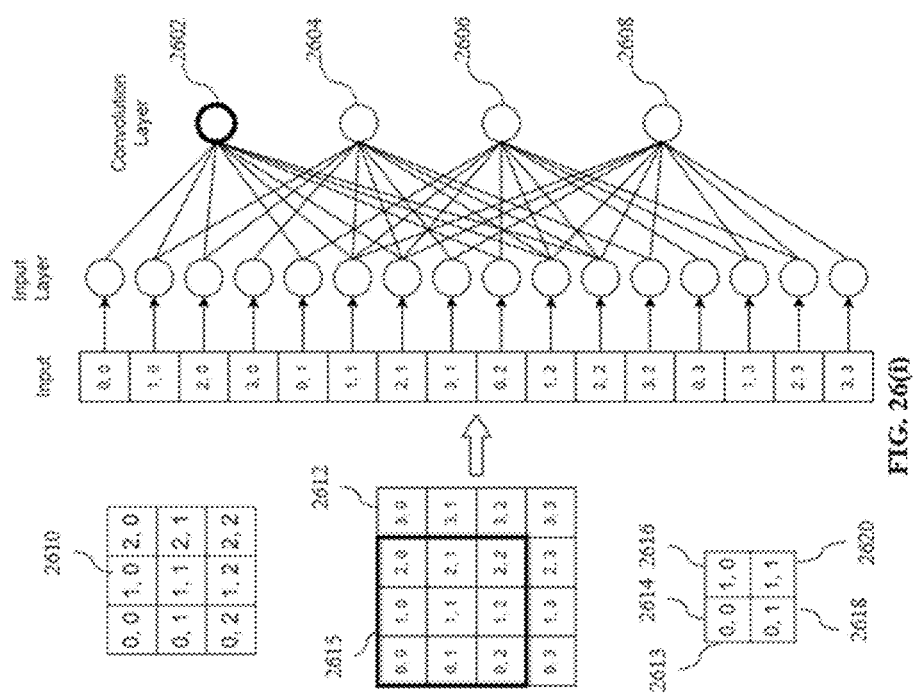

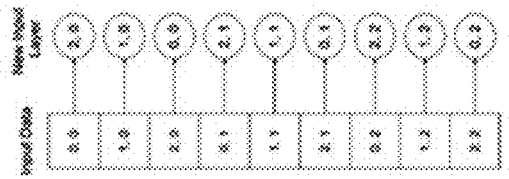
FIG. 27(iv)
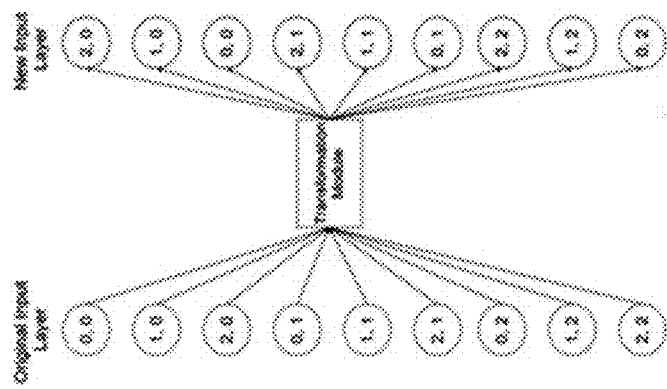
FIG. 27(iii)
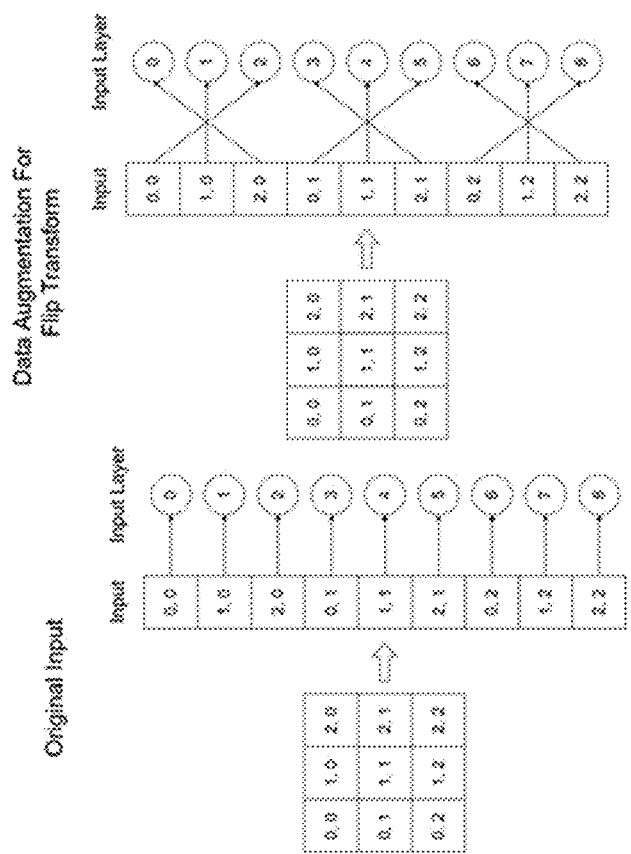
FIG. 27(ii)
FIG. 27(i)

EVENT-BASED EXTRACTION OF FEATURES IN A CONVOLUTIONAL SPIKING NEURAL NETWORK

CROSS-REFERENCE TO RELATED APPLICATION(S)

This application is a continuation-in-part of PCT Application No. PCT/US2020/043456, titled "Event-based Classification of Features in a Reconfigurable and Temporally Coded Convolutional Spiking Neural Network," which was filed on Jul. 24, 2020, which claims the benefit of U.S. Provisional Application No. 62/878,426, filed on Jul. 25, 2019, titled "Event-based Classification of Features in a Reconfigurable and Temporally Coded Convolutional Spiking Neural Network," all of which are hereby incorporated by reference in their entirety for all purposes.

This application is related to U.S. patent application Ser. No. 16/670,368, filed Oct. 31, 2019, and U.S. Provisional Application No. 62/754,348, filed Nov. 1, 2018, each of which are herein incorporated by reference in their entireties.

BACKGROUND

Field

Embodiments herein relate to feature extraction and object recognition in a deep spiking neural network.

Background

A conventional deep convolutional neural network is comprised of many layers of neurons comprised of computed functions, whereby the input values and output value are floating-point numbers. The foremost use of convolutional neural networks is in object classification in digital images. The input values to the first layer of the neural network are samples of the signals for which classification is desired. Typical signals are sensory signals, such as visual signals, audio signals, and the like. Samples of visual signals include pixel values expressing color intensities in an image, while samples of audio signals include frequency component values as input values. Deep convolutional neural networks have three or more layers of neurons. Each layer receives inputs from the layer before it. Each input value is multiplied by a value that represents the weight of the connection, which are generally 32-bit integer or floating point numbers. Each neuron in the neural network can have many inputs, and the result of these multiplications is added to create a sum value. A non-linear function, such as the rectified linear function (ReLU) is applied to the sum value to produce an output value. The convolution is a function that is computationally applied to floating-point data to extract a feature from a defined area of the previous layer. Pooling layers are commonly inserted between convolutional layers to down-size the data. Pooling layers operate on a defined block of data from the previous layer and perform a max, average or mean pooling to reduce dimensionality.

Deep convolutional neural networks have been very successful in object classification tasks using image datasets. A typical deep convolutional neural network may need to perform in excess of 3 billion multiply-accumulate functions to classify a single object in an image. The processing nodes used in general-purpose computers are usually not fast enough to perform the billions of operations required for classification within a reasonable time span. Arrays of specialized multiply-accumulate devices, graphics processing units (GPU), vector processors, analog multipliers and Digital signal processors have been used to increase the throughput and reduce the latency of deep convolutional neural networks. All these devices have in common that they operate computational cores in parallel and process sequences of data rapid succession, thus being able to process large data sets in a short time. However, with great computational power comes high power consumption. A typical graphics processing unit may consume as much as 200 to 300 watts. There have been attempts to create devices that work by the same principles and consume less power, but due to their limited number of processing cores these are not capable of processing image data at the same speed. There is a need for a device that can classify objects in images at a high speed and at low power consumption.

Spiking neural networks have the advantage that the neural circuits consume power only when they are switching, this is, when they are producing a spike. In sparse networks, the number of spikes is designed to be minimal. The power consumption of such circuits is very low, typically thousands of times lower than the power consumed by a graphics processing unit used to perform a similar neural network function. However, up to now temporal spiking neural networks have not been able to meet the accuracy demands of image classification. Spiking neural networks comprise a network of threshold units, and spike inputs connected to weights that are additively integrated to create a value that is compared to one or more thresholds. No multiplication functions are used. Previous attempts to use spiking neural networks in classification tasks have failed because of erroneous assumptions and subsequent inefficient spike rate approximation of conventional convolutional neural networks and architectures. In spike rate coding methods, the values that are transmitted between neurons in a conventional convolutional neural network are instead approximated as spike trains, whereby the number of spikes represent a floating-point or integer value which means that no accuracy gains or sparsity benefits may be expected. Such rate-coded systems are also significantly slower than temporal-coded systems, since it takes time to process sufficient spikes to transmit a number in a rate-coded system. The present invention avoids those mistakes and returns excellent results on complex data sets and frame-based images.

SUMMARY OF THE INVENTION

In accordance with a first aspect of the present invention, there is provided a system, comprising:
  a memory for storing data representative of at least one kernel;
  a plurality of spiking neuron circuits;
  an input module for receiving spikes related to digital data, wherein each spike is relevant to a spiking neuron circuit and each spike has an associated spatial coordinate corresponding to a location in an input spike array;
  a transformation module configured to:
    transform a kernel to produce a transformed kernel having an increased resolution relative to the kernel; and/or
    transform the input spike array to produce a transformed input spike array having an increased resolution relative to the input spike array;
  a packet collection module configured to collect spikes until a predetermined number of spikes relevant to the input spike array have been collected in a packet in memory, and to organize the collected relevant spikes in the packet based on the spatial coordinates of the spikes; and a convolutional neural processor configured to perform event-based convolution using memory and at least one of the transformed input spike array and the transformed kernel.

In an embodiment, the event-based convolution using the transformed input spike array produces a transposed convolved output.

In an embodiment, the transformation module is arranged to transform the input spike array by dilating the input spike array.

In an embodiment, the transformation module is arranged to transform the input spike array by padding the input spike array with zeros.

In an embodiment, the memory stores data representative of transformed input spike arrays.

In an embodiment, the memory stores data representative of input spike arrays and the transformation module is arranged to transform an input spike array after the input spike array is read from memory.

In an embodiment, the event-based convolution using the transformed kernel produces a dilated convolved output.

In an embodiment, the transformation module is arranged to transform the kernel by dilating the kernel.

In an embodiment, the memory stores data representative of transformed kernels.

In an embodiment, the memory stores data representative of kernels and the transformation module is arranged to transform a kernel after the kernel is read from memory.

In an embodiment, the data representative of at least one kernel is data representative of a 1800 rotated kernel.

In an embodiment, the digital data is representative of an image; and the system is arranged to:
 apply a transformation function to the received spikes in order to generate transformed spikes related to at least one further image that is similar to the input image, or
 apply a transformation function to the spiking neuron circuits in order to simulate transformed neuron circuits, so that the transformed neuron circuits receive the spikes related to the input image; and
 wherein the convolutional neural processor determines a convolution output for the further image, the convolutional neural processor configured to perform event-based convolution using memory and at least one of:
 the transformed spikes received by the spiking neuron circuits, and
 the spikes received by the transformed neuron circuits.

In an embodiment, the received spikes correspond to a plurality of channels, and the packet collection module is further configured to organize the collected relevant spikes by channel in the packet.

In an embodiment, the memory is further configured to store kernel weights indexed by channel.

In an embodiment, the system comprises an inbound filter configured to select relevant spikes for reception by the input layer.

In an embodiment, the inbound filter is configured to remove spikes that are outside a scope of the convolution neural processor.

In an embodiment, the convolution neural processor is configured to implement event-based convolution by:
 identifying spike values in an input spike array or transformed spike array;
 multiplying each element of a kernel or transformed kernel by each identified spike value in the input spike array or the transformed spike array;
 calculating a potential using the multiplied elements and spike values; and
 using the potential to produce an output event.

In accordance with a second aspect of the present invention, there is provided a system comprising:
 a memory for storing data representative of at least one kernel;
 a plurality of spiking neuron circuits;
 an input module for receiving spikes related to an input image, wherein each spike is relevant to a spiking neuron circuit;
 a transformation module configured to:
  apply a transformation function to the received spikes in order to generate transformed spikes related to at least one further image that is similar to the input image, or
  apply a transformation function to the spiking neuron circuits in order to simulate transformed neuron circuits, so that the transformed neuron circuits receive the spikes related to the input image; and
 a convolutional neural processor to determine a convolution output for the further image, the convolutional neural processor configured to perform event-based convolution using memory and at least one of:
  the transformed spikes received by the spiking neuron circuits, and
  the spikes received by the transformed neuron circuits.

In accordance with a third aspect of the present invention, there is provided a method for performing event-based convolution, comprising:
 storing in memory, data representative of at least one kernel;
 receiving, by an input module, spikes related to digital data, wherein each spike is relevant to a spiking neuron circuit and each spike has an associated spatial coordinate corresponding to a location in an input spike array;
 transforming, by a transformation module,
  a kernel to produce a transformed kernel having an increased resolution relative to the kernel; and/or
  the input spike array to produce a transformed input spike array having an increased resolution relative to the input spike array;
 collecting, by packet collection module, spikes until a predetermined number of spikes relevant to the input spike array have been collected in a packet in memory, and to organize the collected relevant spikes in the packet based on the spatial coordinates of the spikes; and
 a convolutional neural processor to determine a convolution output for the further image, the convolutional neural processor configured to perform event-based convolution using memory, kernels and the received spikes.

In accordance with a fourth aspect of the present invention, there is provided a method of performing convolution, the method comprising:
 storing in memory, data representative of at least one kernel;
 receiving, by an input module, spikes related to an input image, wherein each spike is relevant to a spiking neuron circuit;
 applying, by a transformation module, a transformation function to the received spikes in order to generate transformed spikes related to at least one further image that is similar to the input image, or a transformation function to the spiking neuron circuits in order to simulate transformed neuron circuits, so that the transformed neuron circuits receive the spikes related to the input image; and determining, by a convolution processor, a convolution output for the further image using memory, kernels and the received spikes.

Further features and advantages, as well as the structure and operation of various embodiments, are described in detail below with reference to the accompanying drawings. It is noted that the specific embodiments described herein are not intended to be limiting. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles of the present invention and to enable a person skilled in the relevant art(s) to make and use the present invention.

Figure 13:
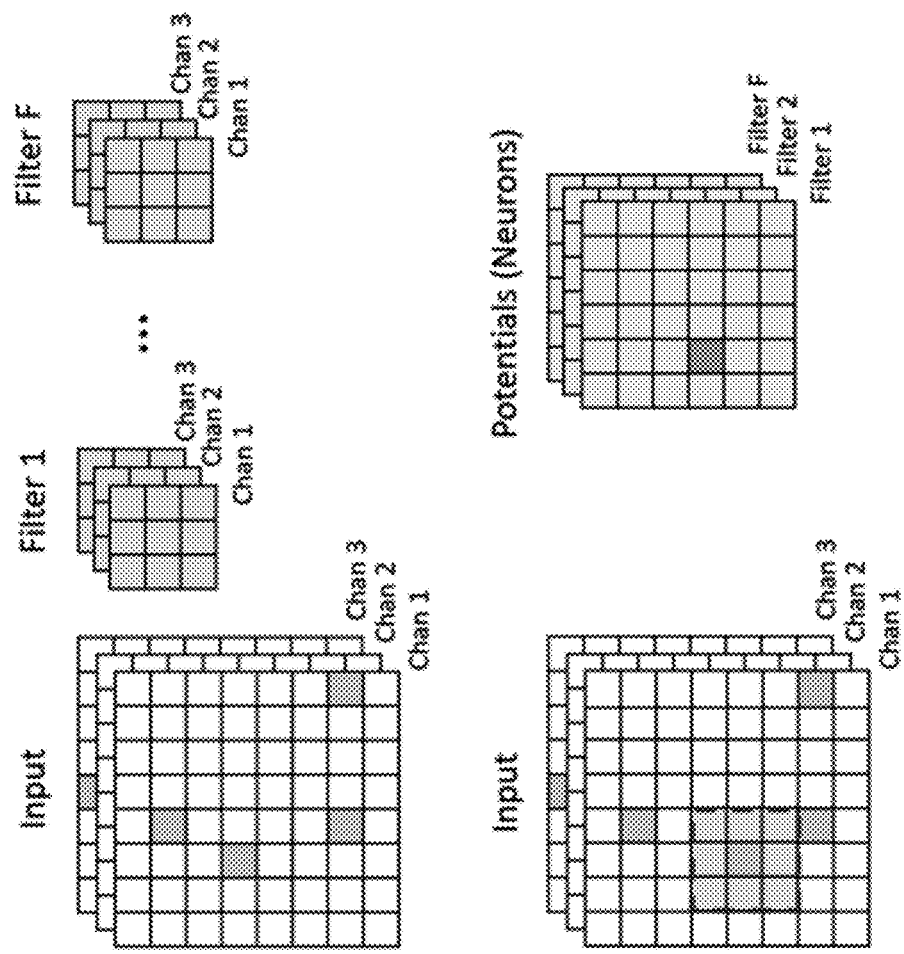

FIG. 13 describes event-based convolution using the filter and neuron terms.

Figure 14:
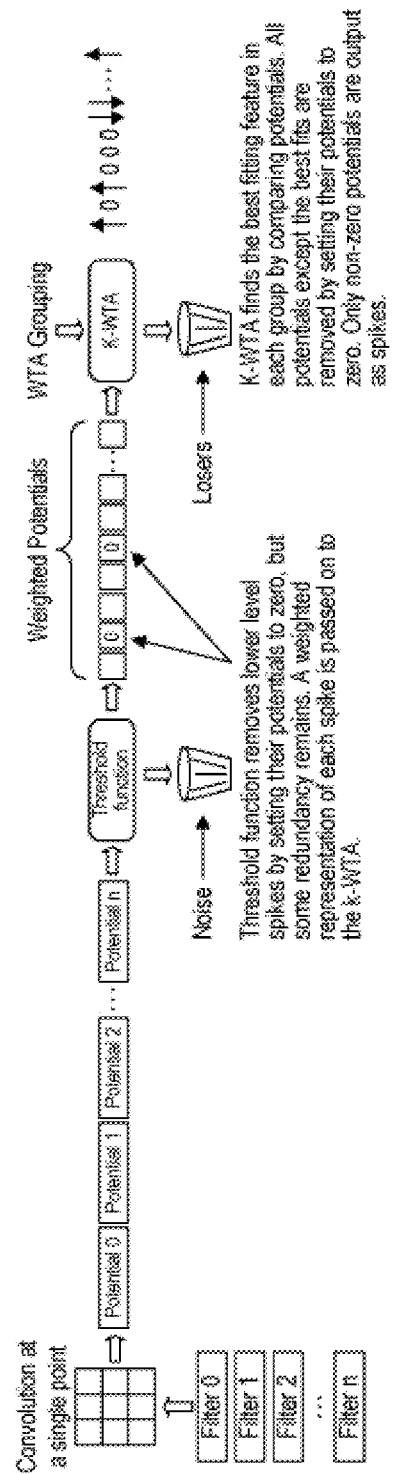

FIG. 14 illustrates the context of an exemplary K-WTA hardware implementation.

Figure 15:
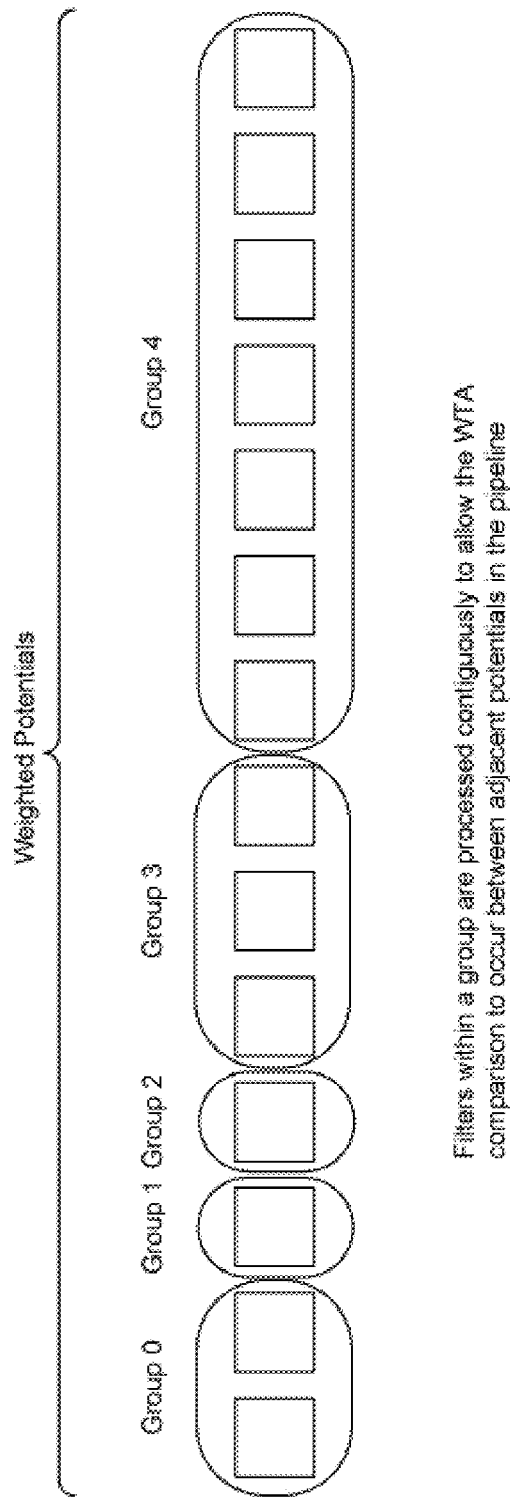

FIG. 15 illustrates that the sizes of the groups can vary.

Figure 16:
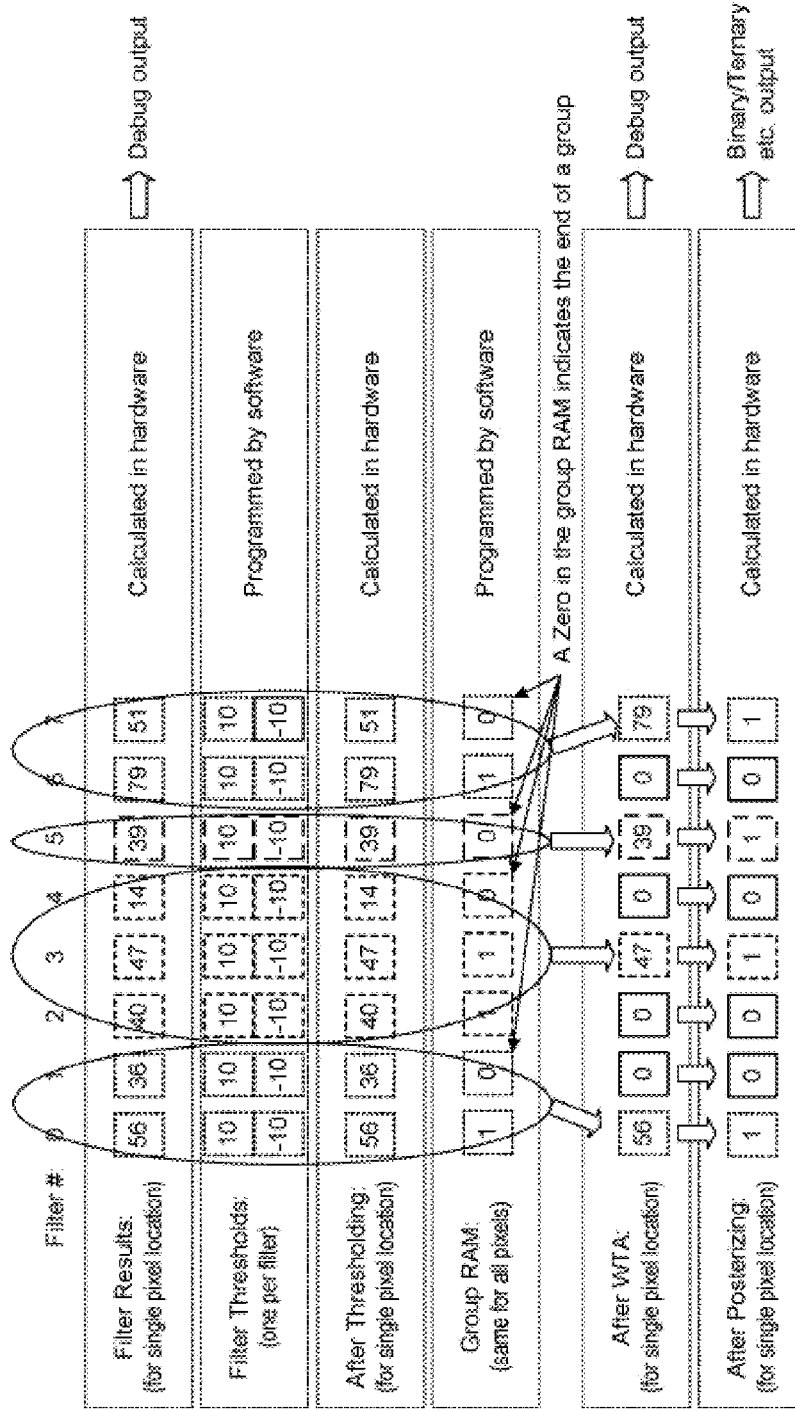

FIG. 16 illustrates how the winners are chosen in a "Best Offer" form.

Figure 17:
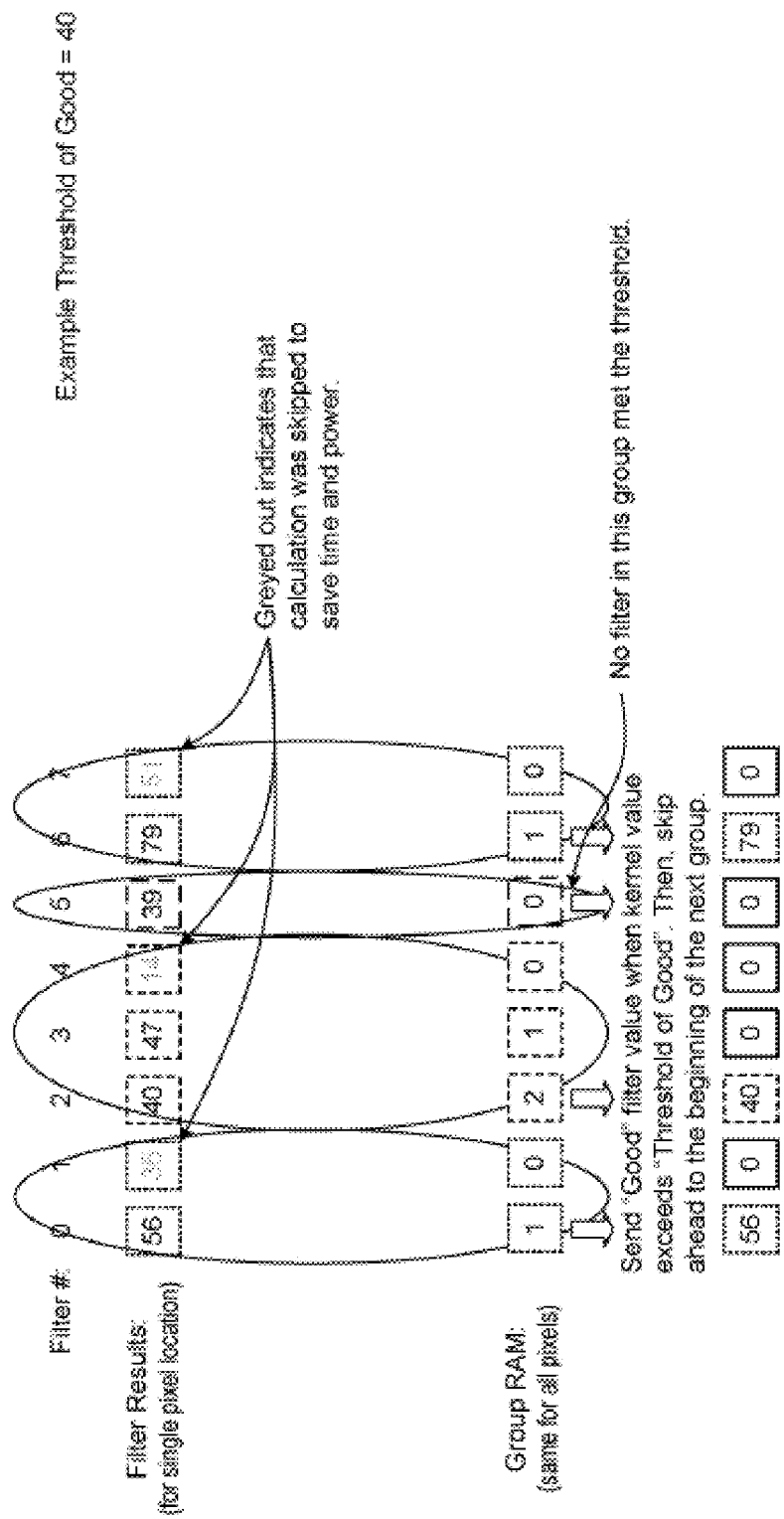

FIG. 17 illustrates an example of K-WTA in "First Good Offer" mode.

Figure 18:
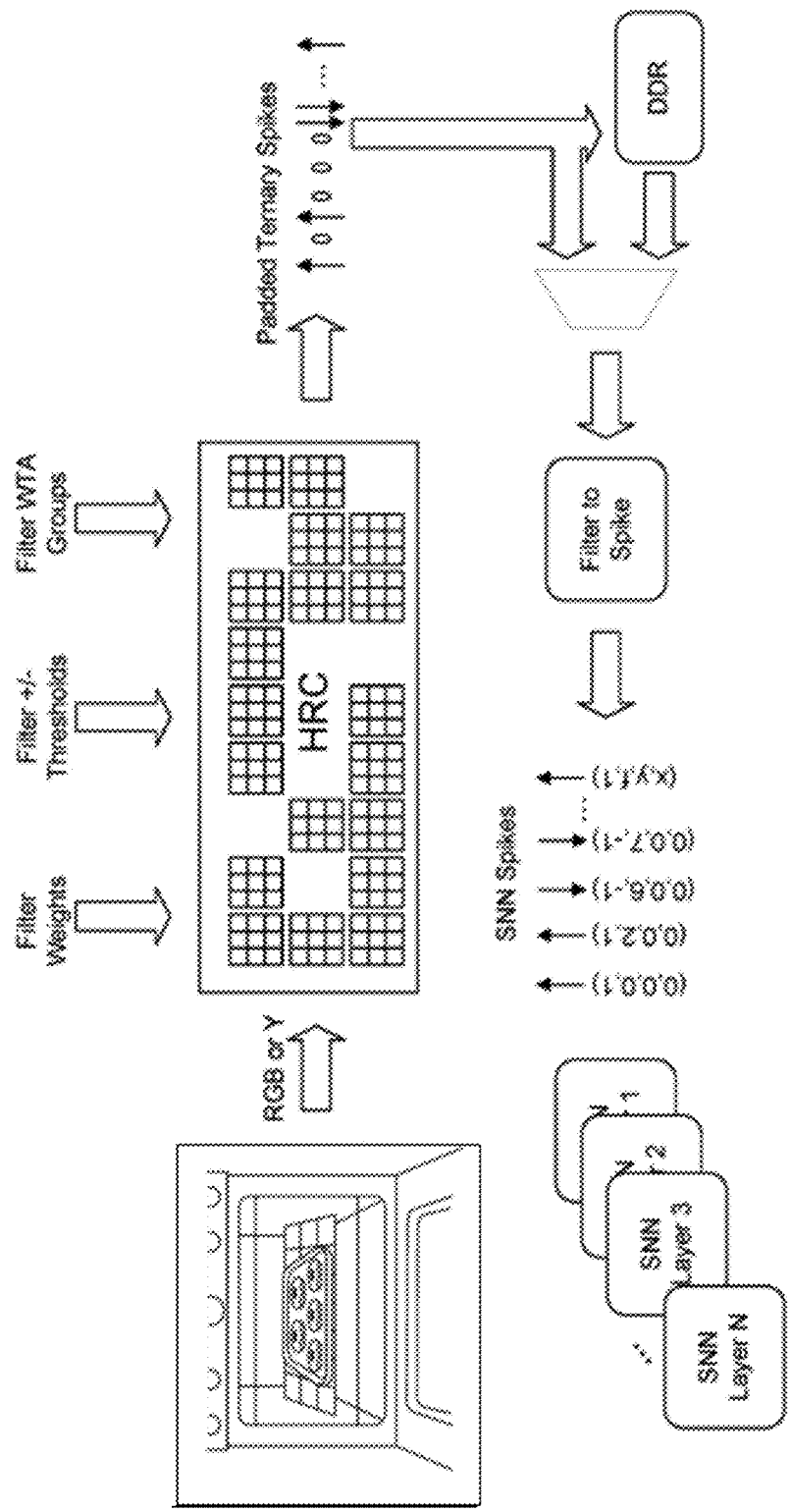

FIG. 18 illustrates implementation in an SNN.

Figure 19:
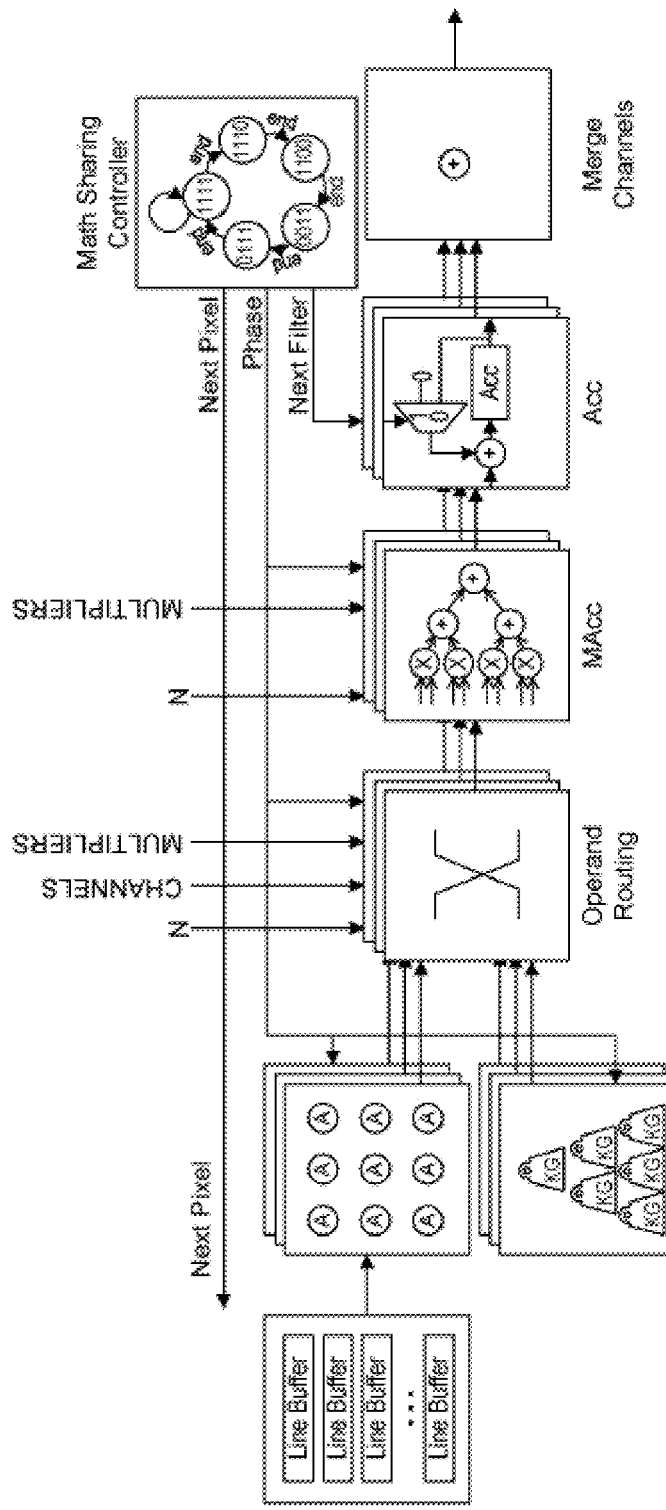

FIG. 19 illustrates a block diagram of an embodiment that generates filter results input to a WTA block.

Figure 20:
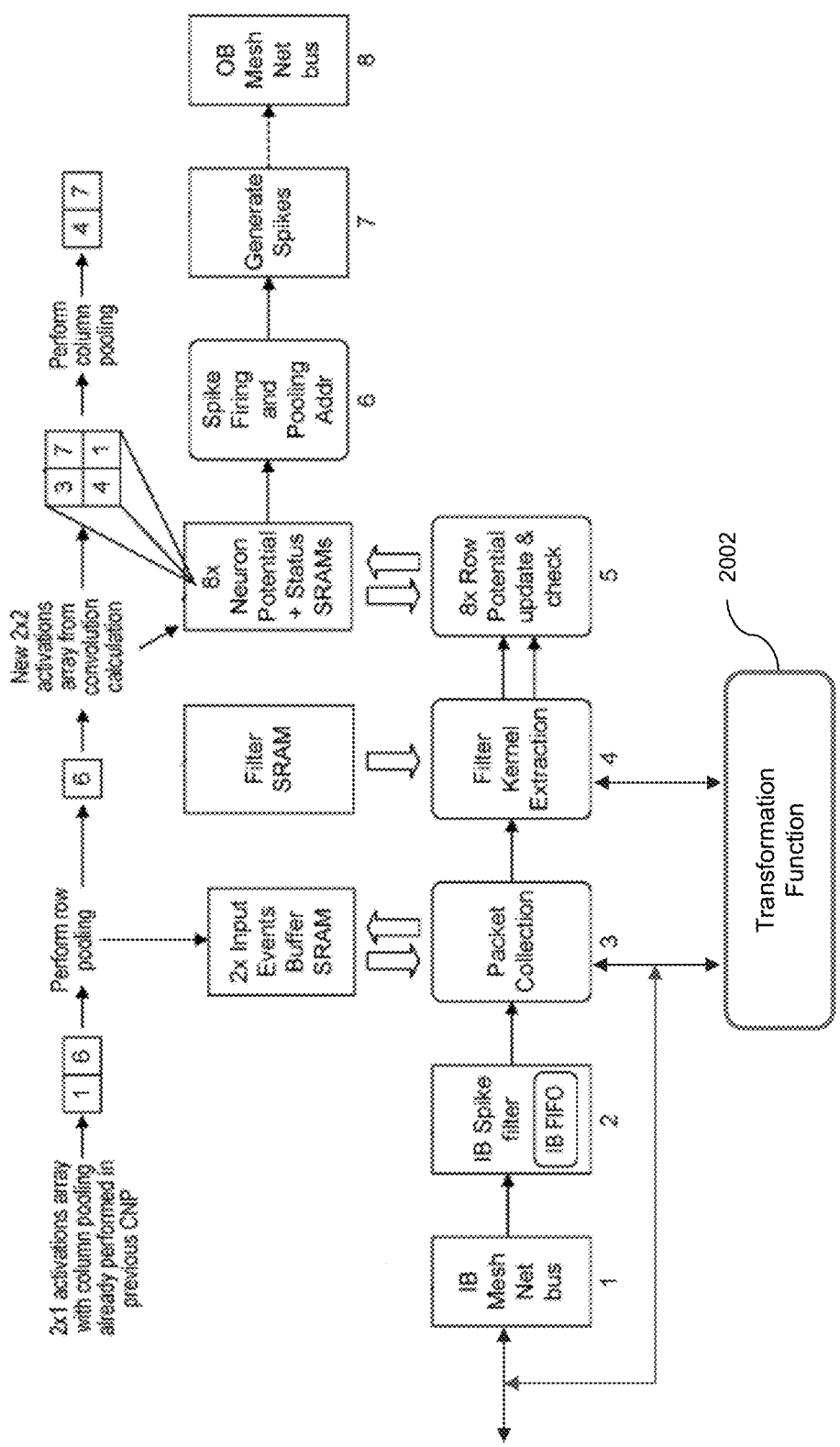

FIG. 20 illustrates a hardware architecture and flow diagram according to an embodiment of the present invention, the architecture implementing event-based transposed convolution, event-based dilated convolution, and data augmentation in hardware.

Figure 21:
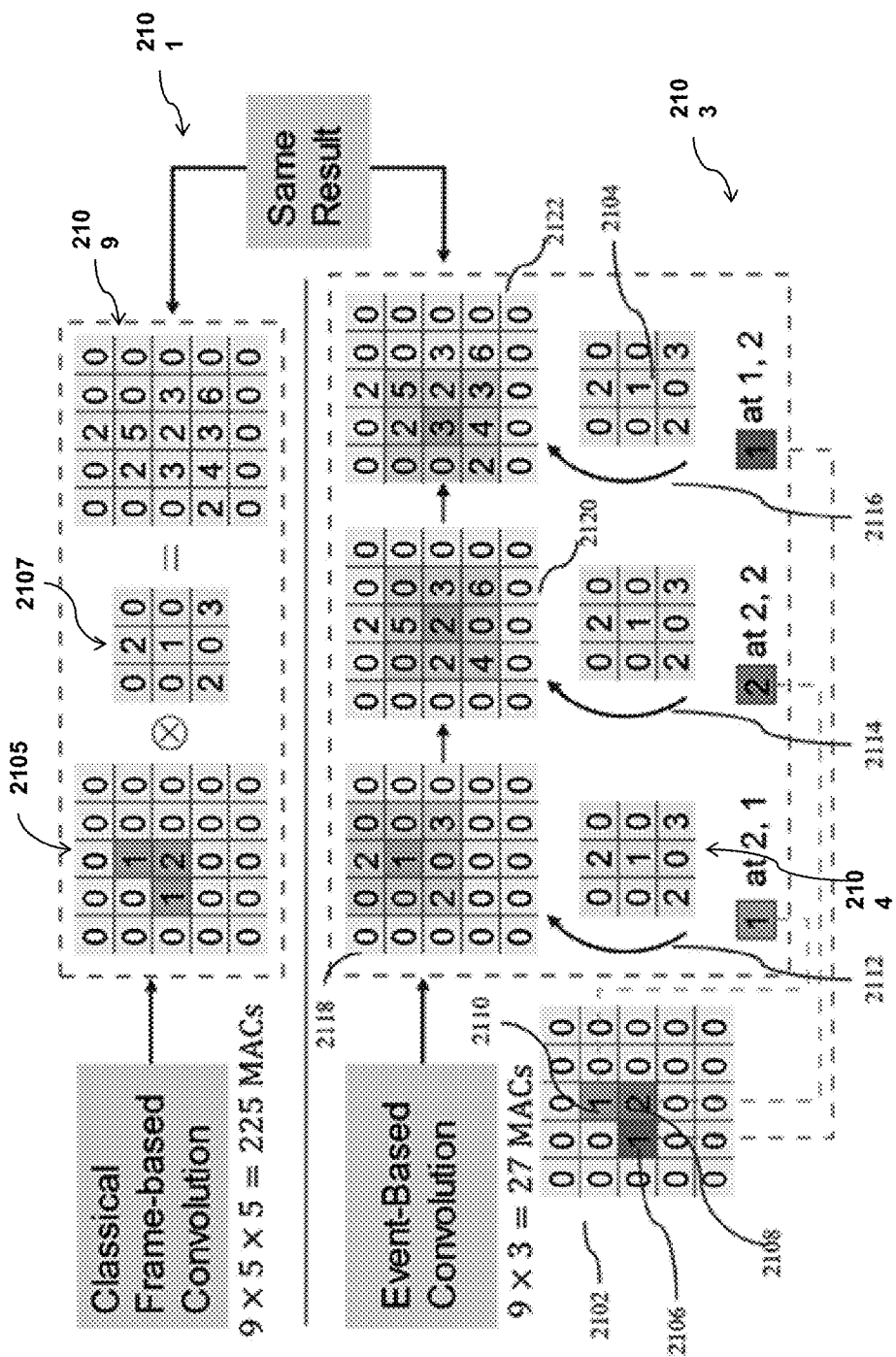

FIG. 21 illustrates examples of classical convolution and event-based convolution.

FIGS. 22($i$), 22($ii$) and 22($iii$) illustrate frame-based transposed convolution techniques.

Figure 23:
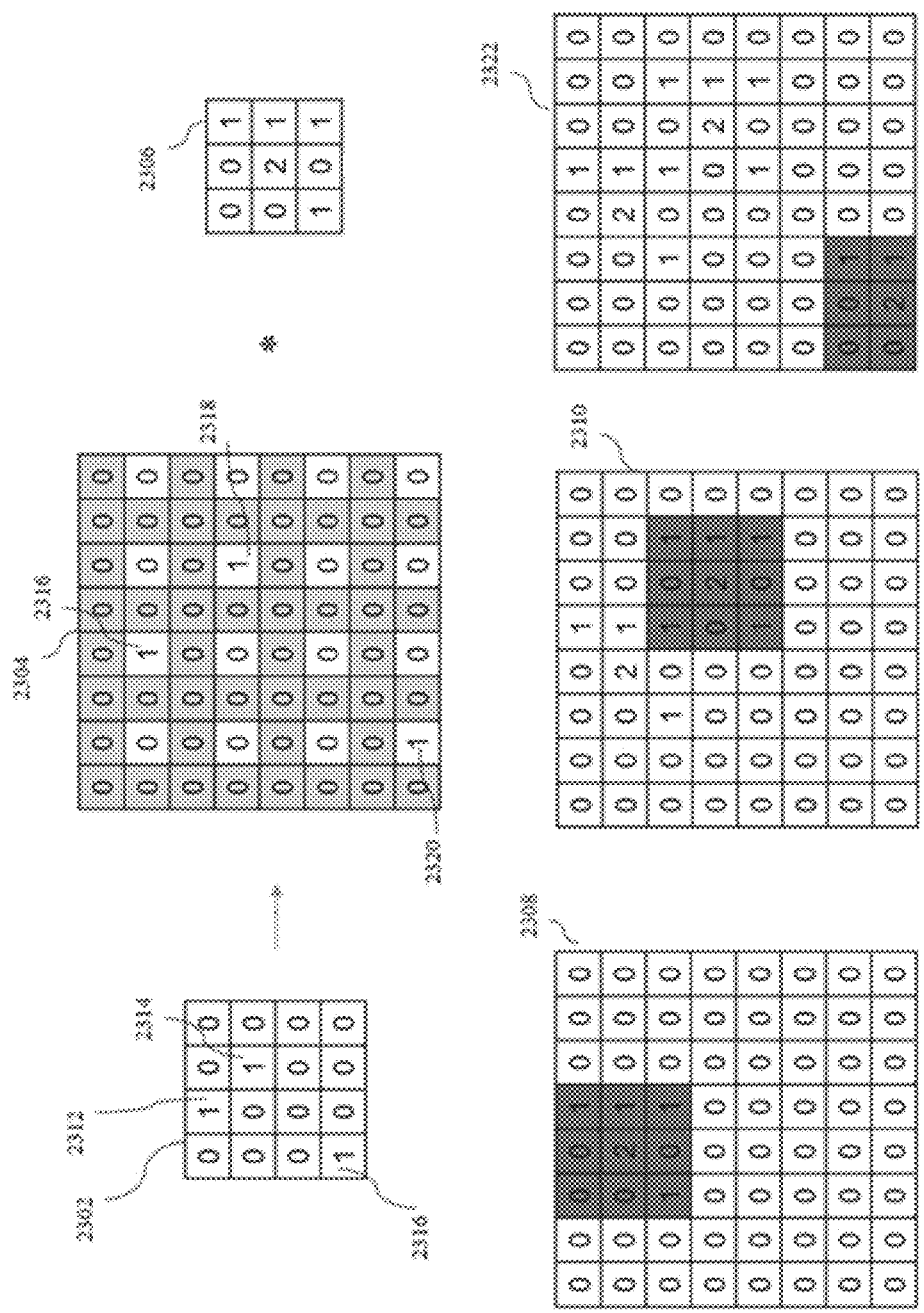

FIG. 23 illustrates an example of event-based transposed convolution in accordance with an embodiment of the present invention.

FIGS. 24($i$) and 24($ii$) illustrate frame-based dilated convolution techniques.

Figure 25:
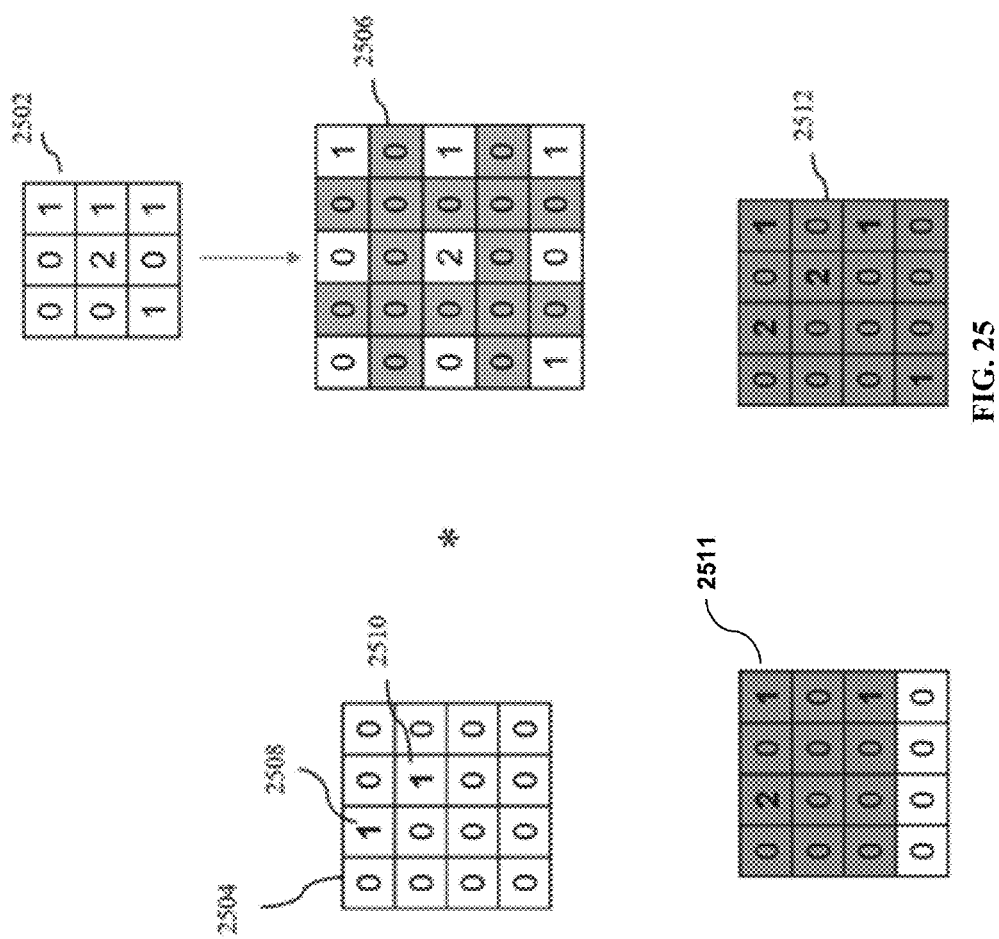

FIG. 25 illustrates an example of event-based dilated convolution in accordance with an embodiment of the present invention.

FIG. 26($i$) illustrates an example input layer of a conventional neural network.

FIG. 26($ii$) illustrates example data transformation operations implemented by an embodiment of the present invention.

FIG. 26($iii$) illustrates transformation of an example input array using a vertical flip transformation operation.

FIGS. 27($i$) and 27($ii$) illustrate conventional and transformed arrangements for connecting an input to input neurons in accordance with an embodiment of the invention.

FIGS. 27($iii$) and FIG. 27($iv$) illustrate transformation of neurons of an input layer and processing of an input by the transformed neurons in accordance with another embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

Glossary

In this description, the memory location where a neuron's potential is incremented or decremented on a per event basis is denoted as the potential. Each neuron has a 20-bit signed potential. After neurons are fully processed, they output a neuronal activation. This activation is from 1-4 bits and is unsigned. These activations are events that are delivered to the next layer, which is stored on a different CNP. The neuron potential can be interpreted to be an unprocessed neuron state while the activation can be viewed as processed neuron state.

Activation: Activations are processed neuron states. Neurons process multiple events in a packet of events. After all events have been processed, they are converted from potentials (unprocessed neuron states) to activations via a transformation that defines how the 20-bit signed potential gets transformed to a 1-4-bit activation. This transformation is called an activation function.

DVS Camera: DVS stands for dynamic vision sensor. DVS cameras generate events which event-based processors like embodiments of the present approach can process directly. Most cameras produce frame-based images. The main advantage to DVS cameras is the low-latency and the potential for extremely low-power operation.

CNP: Convolutional Neural Processor. Each NP is a processing core in the chip embodying the present approach. Each can be either a CNP or an FNP depending on user-configuration, but not both. The CNPs perform event-based convolution or separable convolution operations.

FNP: Fully-connected Neural Processor. These processing cores are connected to inputs by the fully-connected topology.

Input Event Buffer/Input Event Buffer Memory: The input event buffer memory holds the incoming events until they are ready for processing by the current layer. The input event buffer memory can be used as a single buffer or as a double ping-pong buffer.

Inverted Kernel Format: The inverted kernel format is the format in which individual filter kernels are stored. The kernels are a 1800 rotation of the original filter kernels. The inverted kernel format allows the CNP hardware to quickly calculate the address of the potential to which an event-weight product should be delivered.

Max Pooling: Max pooling is an operation that has N inputs and produces a single output that has the value of the maximum input. Spatial pooling is often done only on the spatial component of convolution. When max pooling is mentioned, it refers specifically to a 2×2 max pooling implementation. A 2×2 max pooling implementation has 2×2=4 input values and a single output value. Max pooling is often used to reduce the dimensionality of a network input and therefore reduce the number of parameters and amount of computation required.

NP: Neural processor. Neural processors can be configured to be either FNPs or CNPs. The chip embodying the present approach has multiple NPs (currently 80).

Ping-Pong Buffer: A ping-pong buffer is a buffer that is broken up into two separate buffers. The first buffer (capture buffer) captures inputs as they arrive asynchronously while the second buffer (processing buffer) contains the inputs that are currently being processed by the NP. A ping-pong buffer is used to hold the input events as it allows the CNP to collect events asynchronously, as they come in. After all the current events have been processed in the processing buffer and the capture buffer has all events in the packet, the capture buffer will transfer all the events to processing buffer for processing.

Potential: A potential is an unprocessed neural state. In the NPs, potentials are stored as 20-bit signed integers. After all events have been processed, a neuron transforms a potential into an event using an activation function. It's possible that a potential does not cross a threshold to become an activation event. In this case, no event is sent.

Processed Neuron State: Another name for activation or neural activation.

Scratchpad memory: The part of the CNP memory that each of the 8 neural processing engines has to store neuron potentials as events are processed. The scratchpad memory is large enough to store 512 20-bit neuron potentials per neural processing engine. Each neural processing engine has its own scratchpad memory.

Unprocessed Neuron State: Another name for potential or neuron potential.

Introduction

This specification discloses one or more embodiments that incorporate the features of this invention. The disclosed embodiment(s) merely exemplify the present invention. The scope of the present invention is not limited to the disclosed embodiment(s).

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

A deep neural network (DNN) is defined as an artificial neural network that has multiple hidden layers between its input and output layers, each layer comprising a perceptron. A Convolutional Neural network (CNN) is a class of DNN that performs convolutions and is primarily used for vision processing. CNNs share synaptic weights between neurons. Shared weight values in a perceptron are referred to as filters (aka kernels). Each layer in a conventional CNN is a perceptron. In the present embodiment, event-based convolution is implemented in a Spiking Neural Network (SNN) using event-based rank-coding rather than rate-coding, which has advantages in speed and considerably lower power consumption. Rank coding differs from rate-coding of spike events in that values are encoded in the order of spikes transmitted. In rate coding the repetition rate of spikes transmitted expresses a real number. CNNs process color images which are defined as: imageWidth×imageHeight×channelNumber. A color image generally has 3 channels (Red, Green, and Blue). CNNs often have many layers, so the output of a convolutional layer is the input to the next convolutional layer. Descriptions are provided as to how convolutions take place in conventional perceptron-based CNN before discussing the event-based convolution methods implemented in the present invention and show that the result of convolution in a CNN and event-based convolution in the present invention return the same results.

Convolution

Figure 1:
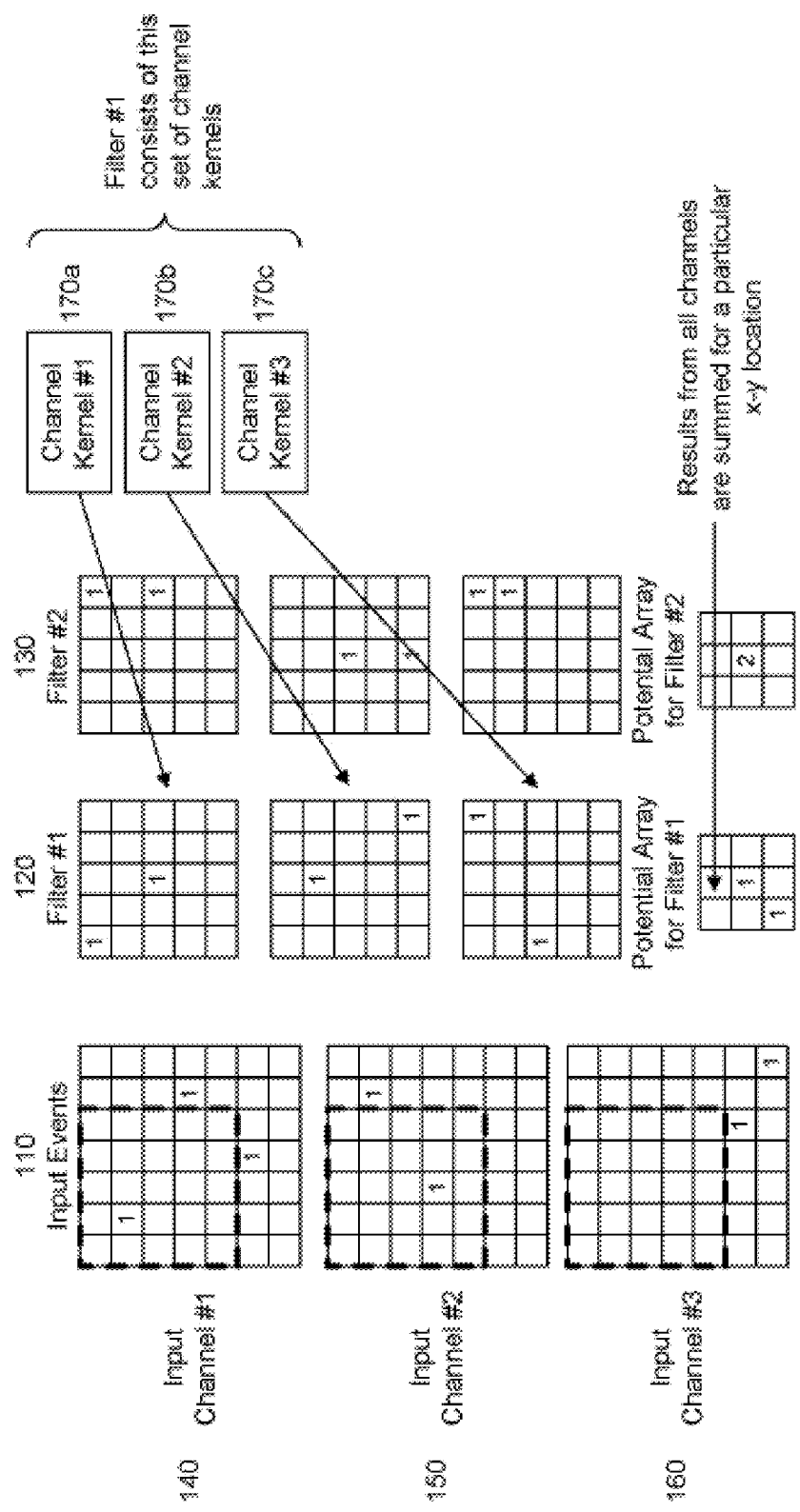
FIG. 1 illustrates a diagram of how 3-channel (red, green and blue) convolutions are performed in a conventional convolutional neural network.

FIG. 1 illustrates the convolution method 100. Two 5 by 5 filters 120, 130 out of a plurality of filters are shown. Filter #1 (120) and #2 (130) have 3 color channel kernels 170a, 170b, 170c, one for each color Red, Green and Blue from the respective input channels 140, 150, 160. The width and height of the filters are smaller than the image, with 3 by 3, 5 by 5, and 7 by 7 being the most common sizes. The filter array is moved across the image area. The results of the convolution are summed into a single value in an array storing neural potentials. The dotted outlines show where the filter #1 convolutions take place over the inputs. The smaller dotted box in the 3 by 3 potential array for filter #1 (120) shows where these inputs are summed.

A feature of the present invention is the absence of multiplications for the case where either the input or the weights or both the inputs and the weights are represented as ternary or 1-bit values. Values are summed and compared to a variable threshold value, which results in a spike event if the threshold value is reached or exceeded. The spike event is transmitted over an internal bus to the next layer of the network. The absence of multiplications results in a distinct speed advantage over prior art.

Figure 2:
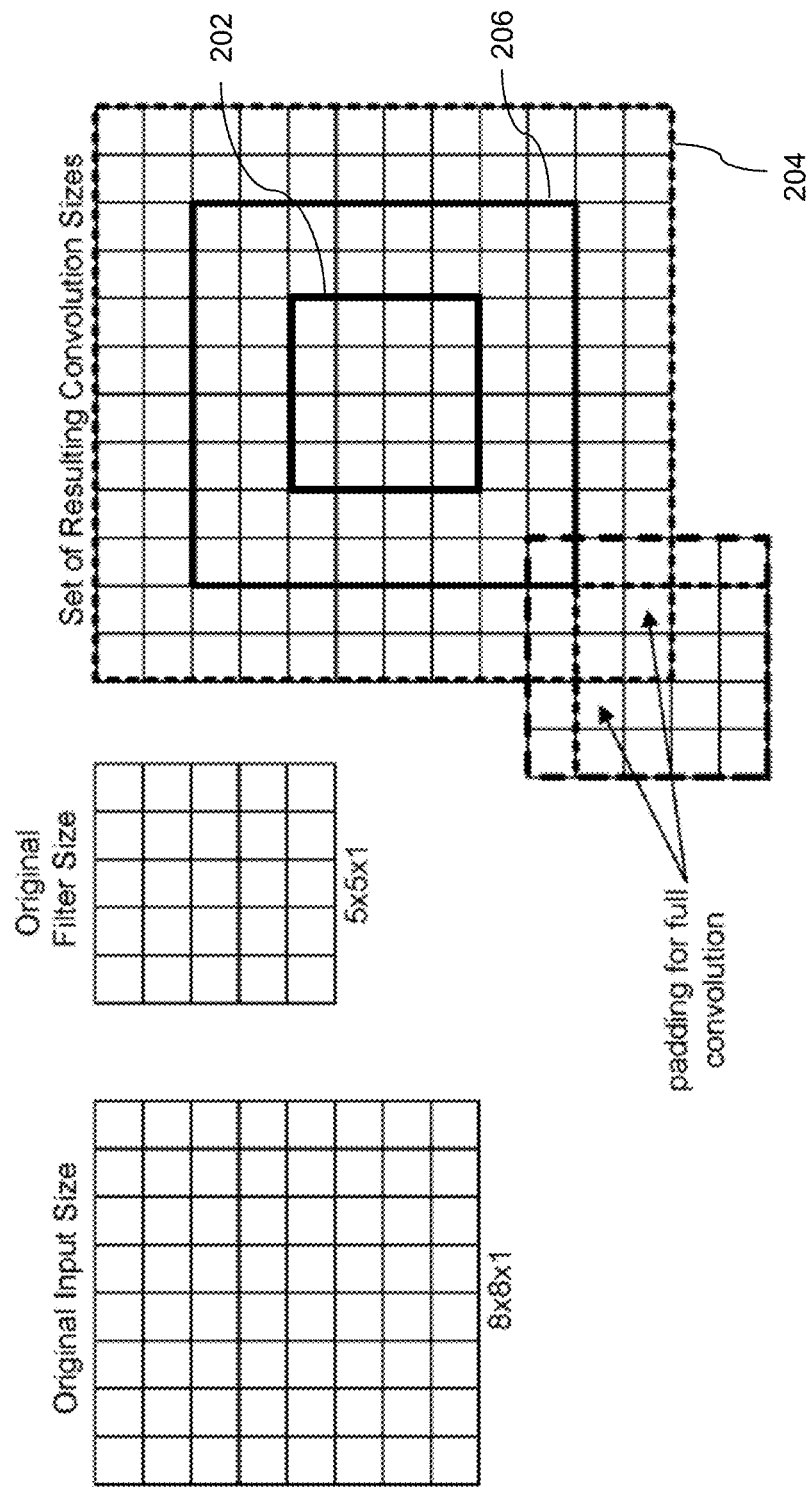
FIG. 2 illustrates an example of a 1-channel convolution for a single 5×5×1 filter.

FIG. 2 illustrates three convolution methods that are implemented in embodiments of the present invention using rank coding. In valid convolution 202, the resulting image area will be smaller than the original since the filter region is moved around the center of the image, leaving the edges out of consideration. In full convolution 204, the image region is padded with zeros, allowing the full image region including the edges to be included in the convolution. In same convolution 206, the edges are included, but the convoluted region is the same as the original image region.

Figure 3:
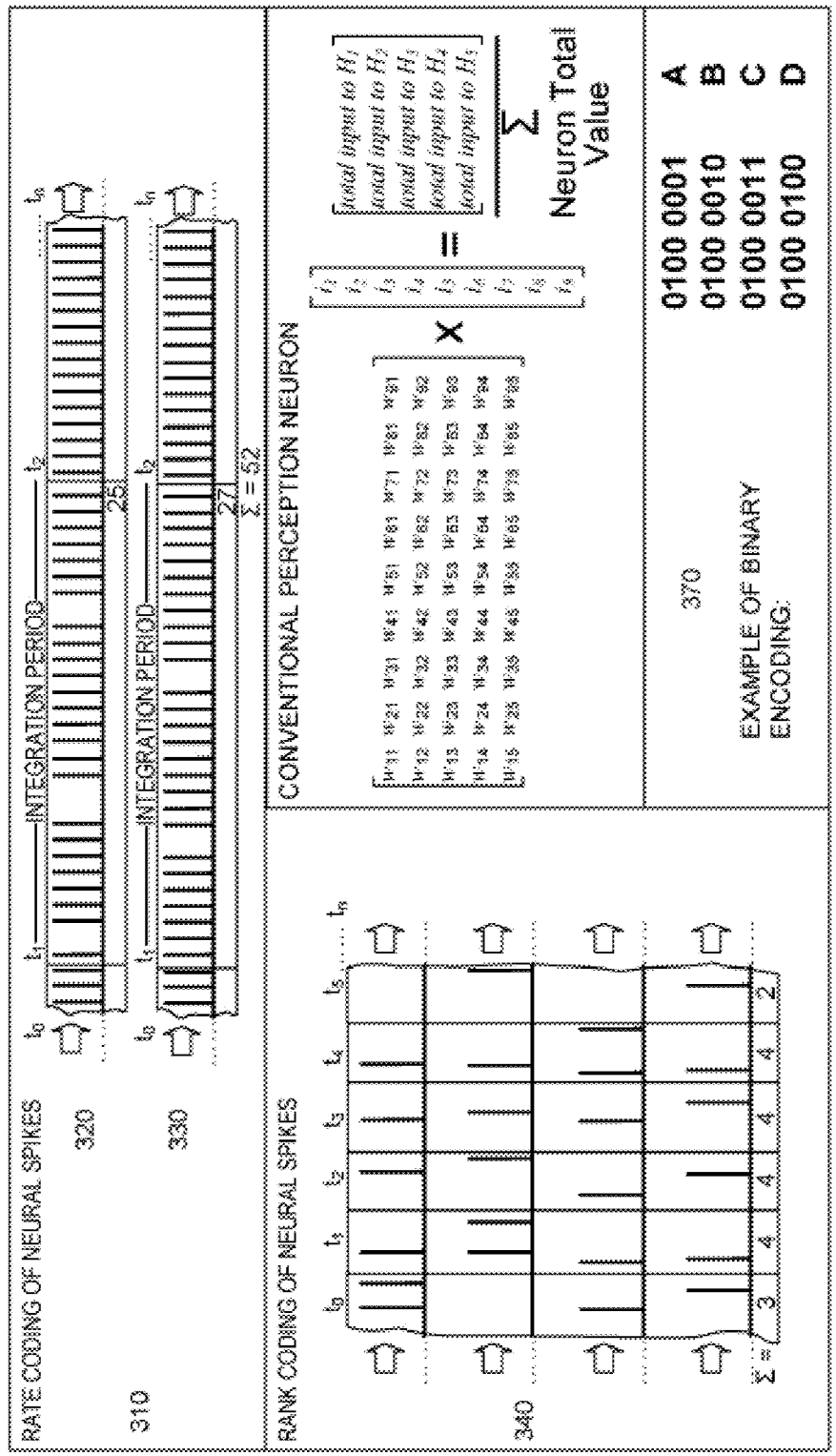
FIG. 3 illustrates the difference between rate coding and event-based rank coding.

FIG. 3 illustrates the difference between neural network spike rate coding, Temporal Spike rank coding, conventional perceptron neuron Multiply Accumulate operations (MAC) and conventional binary coding of characters in a computer system. In the present invention spike rank coding is used.

Rate coding is shown in the top panel 310. The spikes received by two input synapses 320, 330 of a multitude of synapses are shown over one complete integration period labeled t1, in a plurality of integration periods. The first synapse received 25 spikes, while the second synapse received 27 spikes during this integration period. The sum of all synapses is 52, which is the simulated membrane potential of the neuron. Subsequently a non-linear function such as Tan h(n) or a linear rectifier (ReLU) function is applied to the simulated output value. The resulting output value is transmitted as a series of spikes to one or more synapses in the next neural layer. The integration time is long to allow sufficient spikes to occur to receive a value. In the lower left panel 330, rank coding is illustrated. The spikes received by four of a multitude of synapses is shown for six integration periods labeled t0 to t5. The integration time is short, and repeating spikes within each integration period are ignored. The integrated value for the first integration period is three, and four in the subsequent four integration periods. The last integration period has the value 2. These values are the simulated membrane potential of the neuron. If the simulated membrane potential reaches or exceeds a threshold value, a spike is transmitted to one or more synapses in the next neural layer. In the middle right hand panel 350, the integration method of a section of a neuron of a plurality of neurons in a conventional perceptron is shown. A collection of weight values labeled W11 to W95 are multiplied with input values I0 to I9. The resulting values are accumulated to form the neuron simulated membrane potential. Subsequently a non-linear function such as Tan h(n) or a linear rectifier (ReLU) function is applied to the simulated output value. The resulting output value is transmitted as an integer or floating-point value to one or more synapses in the next neural layer. In the lower right-hand panel 370, a conventional binary coding method is shown for reference. Binary coding schemes are widely used in conventional computer systems to encode characters and numbers. Boolean algebra is applied to compute with binary coded numbers and characters.

Figure 4:
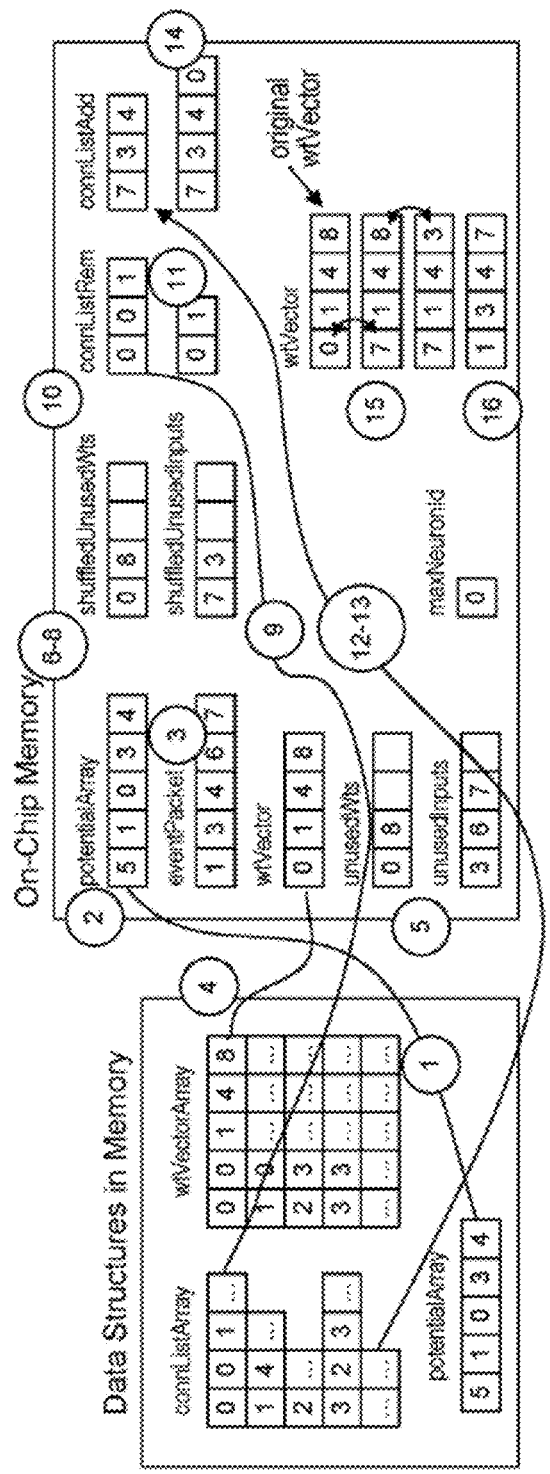
FIG. 4 illustrates the learning process in fully connected and convolutional layers.

FIG. 4 illustrates the learning method that is used in embodiments of the present invention. Two on-chip memory blocks and their content are shown. According to the method:

(1) An array of simulated membrane potentials of five neurons with value 5, 1, 0, 3 and 4 are loaded from data structures in memory into working memory. These values are derived from spikes that have been received by the neuron at synapses that contained weight values other than zero.
(2) The neuron with a potential that is above the learning threshold is selected. In the illustration this is 5.
(3) The event packet is sorted in order from low to high.
(4) The packet of events for that neuron is loaded into memory, together with the relevant weight vectors.
(5) An Unused-Weights entry is created in an array wherever weight vectors do not coincide with event packet values, and an Unused-Inputs entry is created in a second array wherever an input event has an associated zero weight value.
(6) Both Unused-Inputs and Unused-Weights arrays are shuffled to create randomness in the learning rule.
(7) The first position in Unused-Inputs and Unused-Weights is selected.
(8) After step (7), the next entry in Unused-Weights and Unused-Inputs array is selected, this process is repeated until all entries have been iterated.
(9) The connection-list array is loaded into working memory.
(10-11) The connection list array is iterated to remove the ID of the neuron with the maximum potential.
(12) Unused spikes are spikes that have an associated weight value of 0.
(13) The unused spike location is swapped with an unused weight value.
(14-15) After the neuron ID is added to the connection list, the weight vectors are stored in a sorted format (16).

Figure 5:
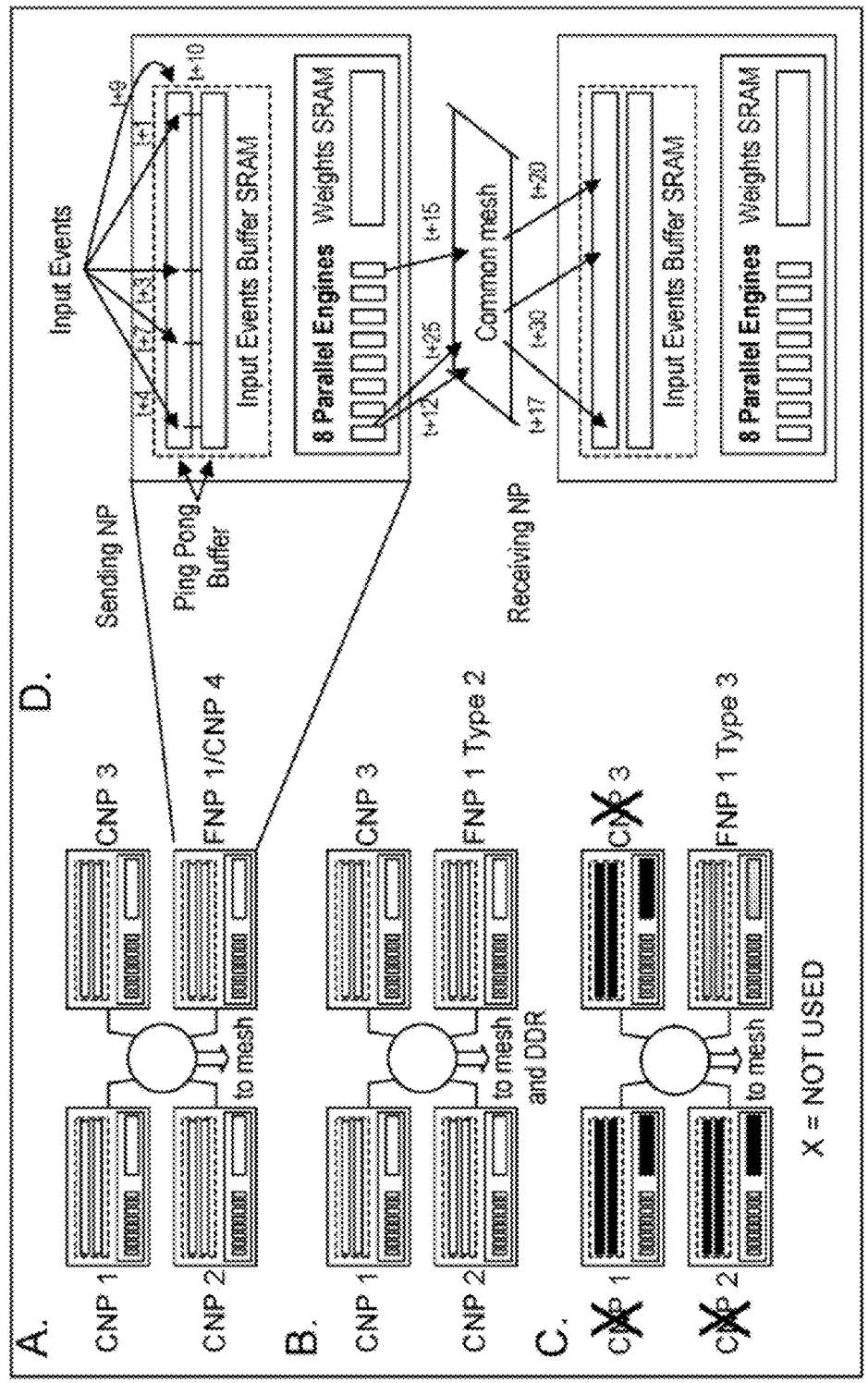
FIG. 5 illustrates three different user-configurable modes of convolutional neural processors and fully connected neural processors.

FIG. 5 illustrates the organization of neural processors (NP). Each neural processor is comprised of a plurality of neurons and a second plurality of synapses. (A) Four neural processors are in a group consisting of three Convolutional Neural Processors (CNP1-CNP3) and one Fully Connected Neural Processor (FNP1) that may be configured during initialization as the fourth CNP (CNP4), or (B) as a fully connected neural processor with limited connectivity (type 2). Type 2 FNP connectivity can be increased using off-chip DRAM. In yet another configuration (C) (type 3) the FNP will use all of the resources of the CNP within the same group. In this case, the FNP will not need to use any external memory which is beneficial in stand-alone applications. A plurality of groups communicates over a common network on a chip, called the mesh illustrated in (D). Input events are placed in a dual buffer (ping-pong buffer) whereby one buffer is processed while the other buffer is filled. Each NP has 8 parallel engines that update a plurality of neurons and a plurality of synapses in parallel. Synapse weights are stored in the Weights SRAM that is on-chip. Each of the 8 parallel engines also communicates with the common mesh bus. The address of the neuron is placed in a packet on the bus when a neuron generates a spike or transmits a potential to the next NP. At the receiving NP, the packet is received into the Input Events Buffer SRAM also named the Ping-Pong buffer for processing by that NP. The t+n (whereby n is a value) in the image indicates the timing of events; t+30 indicates that the information is received in the buffer at time t+30 cycles, where the values are stored in the buffer at time t.

As is known in the art, deep neural networks (DNNs) have become a popular choice for tasks such as image classification, face recognition, and the like. However, the typical implementation has resulted in the need for massive computations on von Neumann architectures, which use substantial energy and require large areas. Consequently, efforts have seen a shift away from conventional digital hardware to implement neural algorithms, including various types of special purpose hardware. However, prominent among the challenges of special purpose hardware is the need for scalability, efficiency and power consumption.

In deriving an architecture in response to these challenges, the inventors identified at least three contributions:
(a) event based operation,
(b) design of the of the hardware, which controls how much information is pushed through, and thereby controls the accuracy and power consumption of the process, and
(c) design of the actual procedure and the precision/bit numbers for the weights and activations in the neural network so that less memory space is used.

The choice of the number of bits is one important consideration in the design of the layers in neural network architecture. The default number of bits commonly used in neural networks is 32 bits, with multipliers being 32 bit by 32 bit. Lesser bits may be used, with a resulting smaller power consumption and chip area required, but with a loss of accuracy. Thus, a 1 bit×1 bit multiplier would represent the lowest limit on bit choice. Initial experiments have shown that a 92% accuracy is achievable using ternary weights. Experiments by the inventors have also shown that a 4×4 bit multiplier provides a sweet spot in terms of relatively low reduction in accuracy (compared with the traditional 32 bit×32 bit approach), while not significantly increasing the power consumption and chip area requirement over that required for a 1 bit×1 bit solution. The sweet spot choice results in a reduction by a factor of 3 to 4 in the number of overall parameters used. In various embodiments, the number of bits used may be different on different layers, i.e., in these embodiments, a layer by layer choice of the number of bits to use (1×1, 2×2, 4×4 etc.) may be made.

In order to make advancements in a hardware-based implementation of a spiking neural network, the inventors sought to reduce the operation count. In various embodiments, the approach is event-based, and the spikes are encoded when necessary, rather than every single convolution stride. Spikes occur only when there are activations, and since events are processed only when spikes occur (rather than upon every convolution stride), there are far fewer events. Since there are fewer events, this results in fewer operations. In a typical embodiment of the present disclosure, the operation count may be reduced by a factor of 3 or 4 by adopting this approach.

The inventors also sought to use a particular convolution type that requires fewer parameters (e.g., weights). Since these parameters require storage in order to perform the necessary neural computations, a reduction in the requirement of physical memory entries results. Although the calculations involved in such a separable convolution are more involved, the additional calculations are manageable and lead to a substantial reduction in the number of parameters, and associated physical memory entries. Such a reduction in the number of physical memory entries enables a much larger neural computational capacity to fit within the given RAM area of a particular chip.

Conventional neural network implementations typically require substantial memory (e.g., SRAM) to save the potential value at each neuron. With the large number of neurons in a typical neural network, the majority of available memory (e.g., SRAM) is used to save potentials associated with the neurons. Consequently, the total number of neurons available in a hardware implementation of an SNN neural network is ultimately limited by the available memory (e.g., SRAM). In order to make advancements in a hardware-only implementation of a spiking neural network, the inventors sought to use memory differently by saving the activation levels, rather than the potential. The magnitude of activation levels requires typically 12 to 20 bits to capture their value, while a spike may be captured in only 1, 2, or 4 bits. This resulting six-fold reduction in bit requirements substantially increases the effective storage capability.

Conventional implementations of neural networks perform the computations in the network by following its structure, one layer at a time. This approach produces a large amount of intermediate data that are steadily output to memory as the computation progresses. Upon completion of a layer, the intermediate data are sent back to the same computational hardware, and the process repeats until computation in all layers has concluded. The amount of intermediate data that must be transported between the computational hardware and memory increases with increasing neural network size. In an additional advancement, the inventors have employed fusion of the computation across multiple layers. Rather than processing each layer to completion before proceeding to the next layer, the inventors have restructured the computation such that multiple layers are computed together, which avoids the need to store or retrieve the intermediate data from the memory. In short, fusing takes the operations of two or more layers and fuses them into a single operation.

Quantitative Metrics

A description is now provided of three areas of quantitative benefit:
(1) the efficiency of the storage of the representation of a "neuronal potential" within the convolutional neural processor (CNP);
(2) the approach to event-based convolution algorithm; namely the filtering of events, ordering of filters, and individual application of increments or decrements to neuronal potentials; and
(3) an unsupervised learning algorithm for convolutional operations in neural networks.

Figures of Merit for Efficient Neuron State Storage on CNPs

Before describing the details of how neurons are stored on CNPs, various terms and the approach by which CNPs process events are described. The memory location where the value of a neuron potential is stored is incremented or decremented on a per-event basis is known simply as the potential. By way of example, each neuron may have a 20-bit signed potential. After neurons are fully processed, they output a neuronal activation. Again, by way of example, this activation may be from 1-4 bits and is unsigned. These activations are events that are delivered to the next layer in the neural network, which is stored on a different CNP. The neuron potential can be interpreted to be an unprocessed neuron state while the activation can be viewed as processed neuron state. If the input to a particular CNN layer has dimensions M×N×C, where M is the height of input, N is the width of input, and C is the number of channels of the input, and the dimensions of the filters are H×W×C, (H and W are filter height and width) and there are F filters in the layer, then the total number resulting potentials (and therefore activations) is M×N×F. A small number of 20-bit signed potentials are temporarily stored in the CNP, where the layer resides, while all activations are stored in the CNPs where these activations will be delivered as events to target layers. Because only a small subset of the 20-bit potentials are stored, a neuron state may be stored at a very high density.

Figure 6:
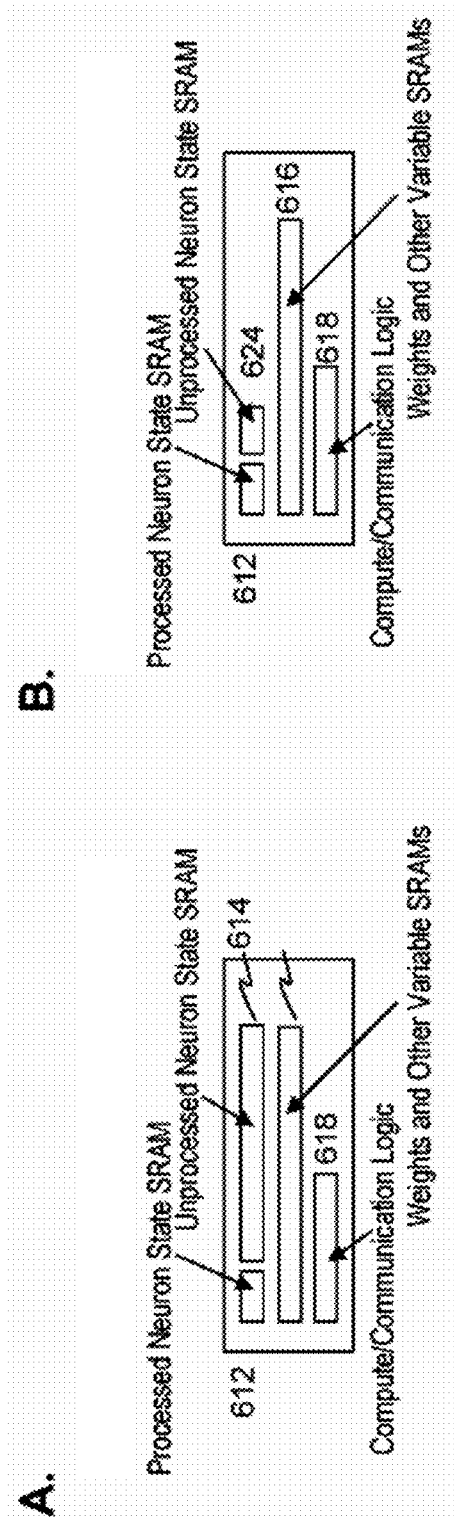
FIG. 6 is a high-level description of a traditional neuron state storage approach that may be contrasted with the neuron state storage approach of certain embodiments of the present approach.

FIG. 6 is a high-level description of a traditional neuron state storage approach 612 that may be contrasted with the neuron state storage approach 614 of certain embodiments of the present approach. Broadly speaking, the entirety of the unprocessed neuron state is not stored at one time when processing a single input, but rather a small subset of it at one time. The subset of unprocessed neuron state that gets stored is then overwritten with new unprocessed neuron state until all computations associated with the input data are completed. By taking this approach, the amount of memory used to store unprocessed neuron state with the present approach in FIG. 6B is less than the amount of memory used in the traditional approach in FIG. 6A. The same number of unprocessed neuron states can be processed using the hardware implementation of the present approach.

Turning now to a description of the neuron state memory management approach in greater detail, there are three main operations that must be performed for a packet, or collection of events, to be fully processed. The first two operations occur for each event. The third operation occurs for each neuron. Before processing, the events are sorted by the neuron. For each event, if the weight value or activation are both greater than ternary, the event value must first be multiplied by the weight value (step 1) (multiplication operations are not necessary when 1 bit or ternary bits are used) and the resulting product must then be added to the potential that corresponds to the neuron being computed (step 2). Third, each potential value is exposed to a unique function that transforms the 20-bit signed potential to a 1-4 bit unsigned activation (signed in the case of ternary activations). Next is a description of when and where a neuron state is stored for each step.

FIG. 7A illustrates an exemplary approach by which each CNP processes events. In a particular example, each CNP has 8 neural processing engines 702 that run in parallel. The memory 704 within these neural processing engines is used to store the potentials and is reused. Steps 1-3 are done across the 8 neural processing engines per CNP. A small subset of the total events are processed at the same time across the 8 neural processing engines. During this time, each of the 8 neural processing engines has enough memory to store 512 20-bit signed potentials. This memory is referred to as neural processing engine scratchpad memory. The combined scratchpad memory 704 across all 8 neural processing engines is then 512*20*8=81,920 bits. This means that each neural processing engine processes 512 neurons at a time. After 512 neurons have been processed, the neural processing engines place the 1-4 bit activation events on the mesh to be delivered to the CNP that is running the layer these events are connected to. The 1-4 bit activation events are routed to the target CNP and stored in this CNPs input event buffer memory (blue rectangles in FIG. 2B). The size of the input event buffer memory is 344,064 bits. Therefore, the total amount of memory per CNP used to store all neuron state is 81,920 bits+344,064 bits=425,984 bits. As one of ordinary skill in the art would appreciate, the above numbers are exemplary rather than limiting values of embodiments of the invention.

Figure 7:
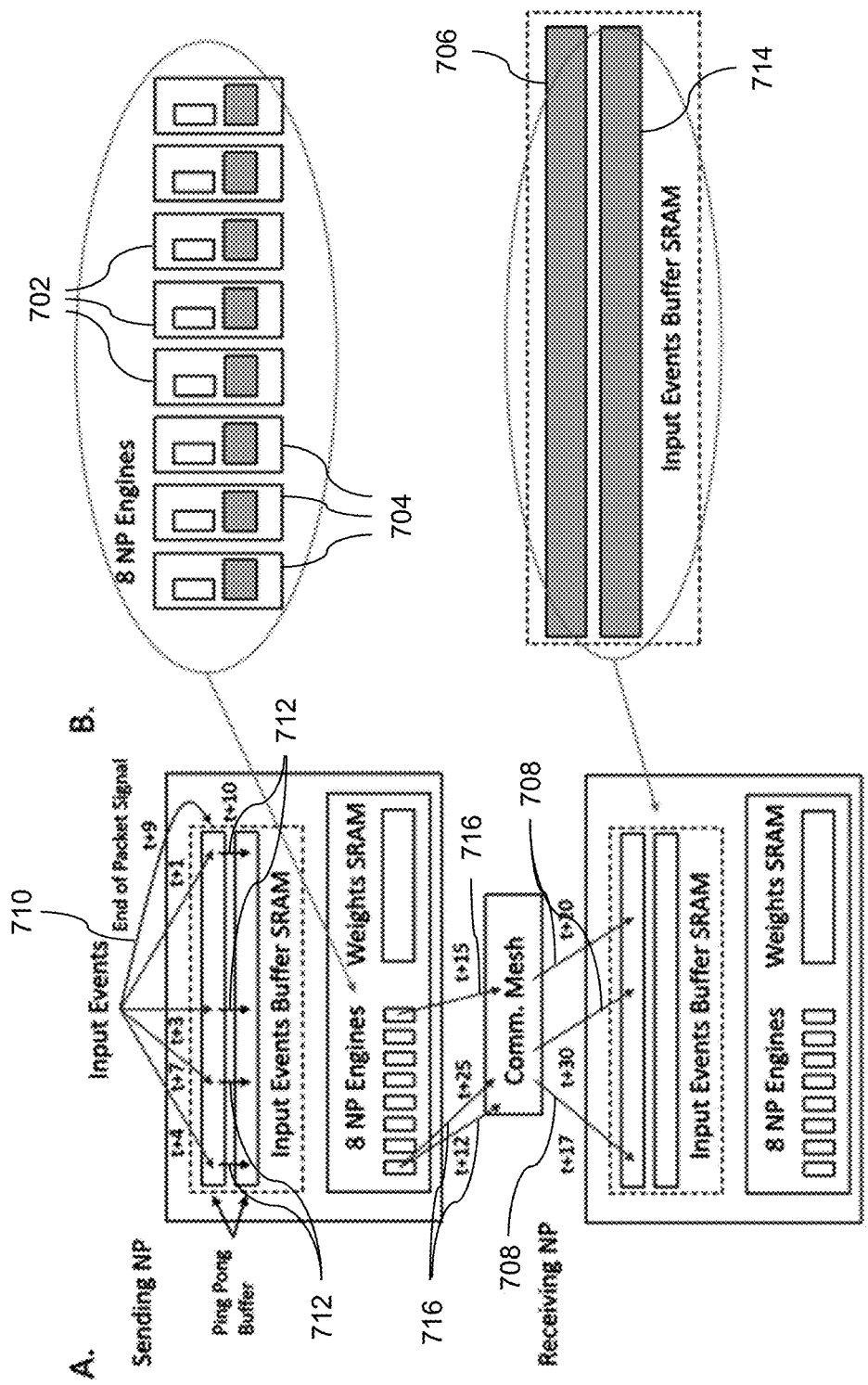
FIG. 7 illustrates an exemplary approach by which each CNP processes events.

FIG. 7 is also an example of how a CNP processes events (in ping-pong buffer mode). The external facing buffer (top box 706 in input events RAM) of the ping-pong buffer places incoming events 708 in their corresponding place as they come in from the mesh. An 'End of Packet Signal' 710 is eventually received, causing the events 712 to be moved from the external facing buffer to the internal facing buffer (bottom box 714 in input events RAM). These events are processed by the 8 NP engines. Output events 716 are placed on the mesh for routing to the next NP as soon as they are calculated, so there is no need to store 20-bit potentials. The time units are arbitrary and just meant to show the order of when things are occurring.

A useful figure of merit—the total number of neurons that can be represented per unit memory—may be used to capture the quantitative benefit of the advancements of various embodiments of the present approach. A neuron is defined to be represented if both its unprocessed state (potential) and processed state (activation) are stored in the memory (e.g., on-chip memory) at some point in time during the event-processing calculation. By memory, only the memory dedicated to holding the neuron state is being referred to, not the entire on-chip memory.

In computing various scenarios for the figure of merit, two considerations should be acknowledged, as part of the calculation of the figure of merit. First, in these exemplary calculations, activation events can range from 1-4 bits in size. Second, CNPs may be configured to use a single-buffer input events buffer or a double-buffer (aka ping-pong) input events buffer. Single-buffers can handle double the number of events that double-buffers can handle at the cost of an increase in latency. With these two considerations in mind, a high-end neuronal density scenario and a low-end neuronal density scenario may be formulated.

In the high-end neuronal density scenario, activation events are only 1-bit and a single-buffer input events buffer is being used. This means the entire input event buffer memory can be dedicated to storing 1-bit activation events, which means 344,064 neurons may be represented. However, the cost of the scratchpad memory needs to be included when the total memory being used is calculated. The ratio of neurons to memory in the high-end neuronal density scenario is then:

Neurons Represented/Unit Memory=(344,064 Neurons)/(425,984 bits)=(344,064 Neurons)/(425,984 bits)=0.81 Neurons/bit In the low-end neuronal density scenario, activation events are 4-bits and a double-buffer input events buffer is being used. The double-buffer means that only half the amount of input event buffer memory is available as was the case for the single-buffer case. Replacing 1-bit activations with 4-bit activations also means a requirement of 4-bit storage for each activation instead of 1 bit; which reduces the total number of activations that can be stored by a factor of 4. The total number of neurons able to be represented per unit memory is reduced by a factor of 8:

Neurons Represented/Unit Memory=(344,064 Neurons)/(8*425,984 bits)=(43,008 Neurons)/(425,984 bits)=0.10 Neurons/bit The range of values for these two scenarios is 0.81-0.10 Neurons/bit. Were one able to use a smaller scratchpad memory and/or potentials that are smaller than 20 bits along with 1 bit activations, then one could presumably achieve even higher densities. It seems that the practical neuron density limit for embodiments would be close to 1 neuron/bit if no compression was used to store the activations. In this scenario, one would calculate the potential for a neuron one at a time and have a single register as the scratchpad memory. The theoretical limit could be greater than 1 if some type of compression was utilized. However, the computational cost of encoding or decoding the activations would potentially outweigh the benefits.

In various embodiments, memory may be realized by various types of memory including volatile SRAM, as well as non-volatile memory technologies.

Figures of Merit for Event-Based Convolution

The next figure of merit captures event-based convolution in the CNP. The CNP is designed to process events and increment (or decrement) the corresponding potential in the scratchpad memory of each neural processing engine in an efficient manner. To ensure that the events can be processed quickly and in parallel by the neural processing engines, a number of optimizations have been integrated into various embodiments of the present approach.

Figure 8:
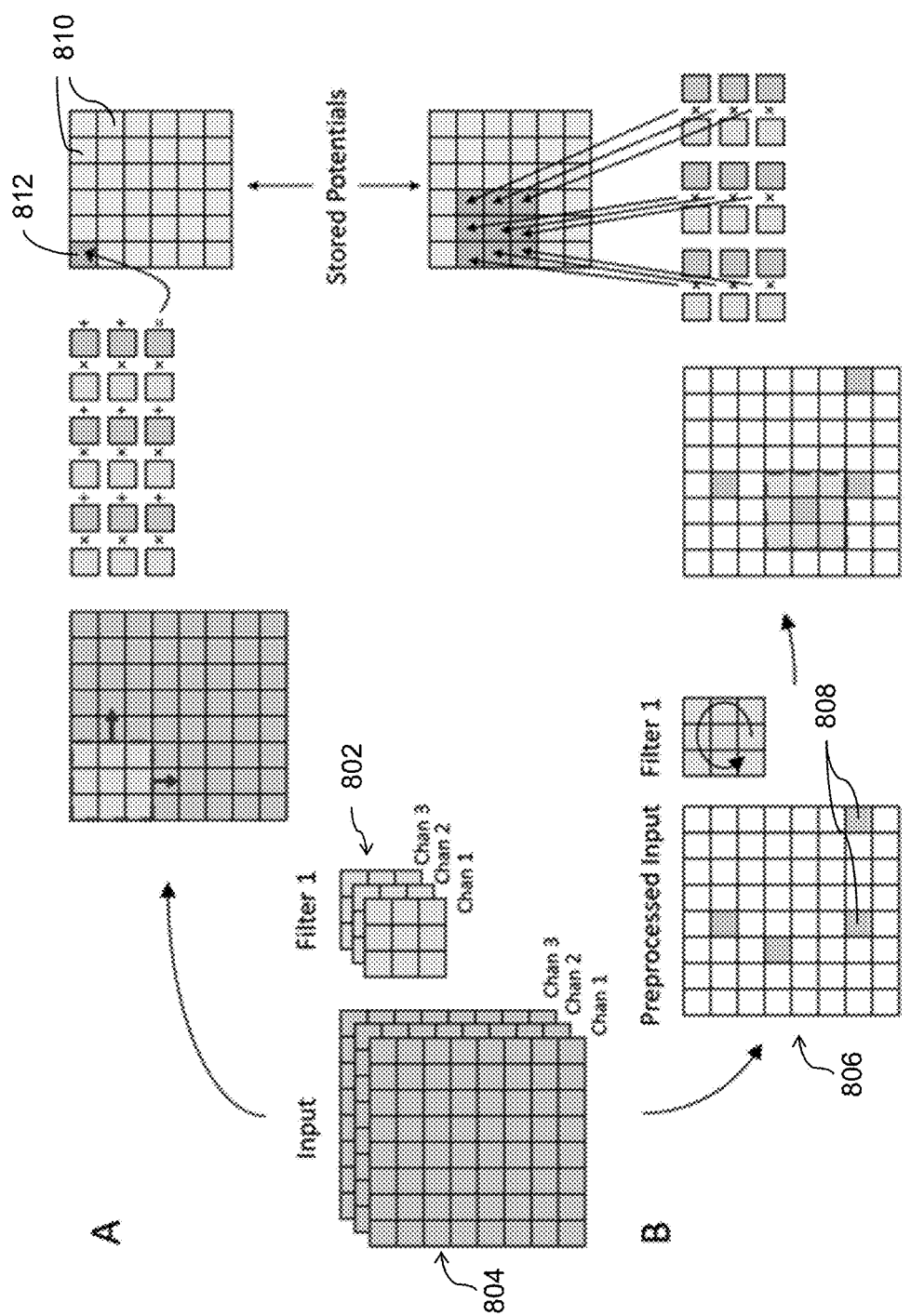
FIG. 8 shows a comparison between a traditional convolution algorithm and an event-based convolution algorithm.

FIG. 8 shows a comparison between a traditional convolution algorithm and the present event-based convolution algorithm. In FIG. 8A, all entries must be computed, even if their values are zero. The convolutional filter 802 is 'slid' across the inputs 804. Note that all contributions to a given potential entry are computed at once in the traditional convolution algorithm. FIG. 8B shows the event-based convolution approach. The frame-based image must be converted into an event-based image 806 first. This can be done by preprocessing or by a dedicated spike encoding area on the chip using the new event-based convolution algorithm. Event-based images from DVS cameras can be directly processed by the algorithm. The gray entries 808 in the preprocessed input are events that must be processed. Note that the number of computations an event-based convolution must perform is directly proportional to the number of events (gray squares). The term 'event sparsity' is the ratio of events to pixels. Note that not all contributions to a given neuron's potential are computed at the same time. Two events may affect the same neuron, and therefore all events must be processed before the event-based convolution computation may be termed complete.

In FIG. 8, it is assumed that the input is a frame-based image. The gray input squares indicate entries that must be computed. Computations are only shown for a single input channel. Part A shows that a traditional convolution must compute every entry in the input by sliding the weight kernel 802 across the input images. The output squares 810 indicate entries in the potential array, with the darker squares 812 corresponding to entries being computed currently. Part B shows the event-based convolution. First, note that frame-based image must be converted to an event-based image via preprocessing. The filter must be rotated by 180°. This allows the hardware to deliver the product of the weight and the input to the current potential location. In this picture, only 4 of the calculations shown in the figure are necessary for the event-based convolution.

Next a description is provided of the process by which an event-based convolution is performed. Note that in this description, the terms "event" and "spike" are used synonymously. Also, recall that events are composed of four pieces of information: the x location of the event, the y location of the event, the channel of the event, and the 1-4-bit value of the event. Events are organized into groups of events called packets.

The Event-Based Convolution

An overview of the architecture of an exemplary convolutional neural processor (the basic unit of processing) includes the following blocks:
  (1) inbound filter block,
  (2) packet collection block,
  (3) filter memory and kernel, and
  (4) convolution operation.

Prior to these blocks there is a spike converter that takes the input data in its native format, and converts it to spikes that may be processed by the subsequent blocks.

The purpose of the first block, the inbound filter block, is to select the spikes of interest for each neuron. Each neuron has a particular portion of an input for which it has an interest, and therefore it activates only when a spike is within its zone of interest. In a color image, an embodiment of the filter for each neuron may have three RGB channels.

The packet collection block accumulates the input spikes over time until there are sufficient spikes to form a packet to process. A packet is a collection of events (spikes) of a fixed predetermined size. Included with the packet collection block are memory, which may be in the form of SRAM or other memory, in which to store the packet as it is being formed. A packet is a collection of events of fixed size, pre-defined. Within the memory, the events (spikes) are organized by channel (e.g., RGB in the case of color image data) and sorted by two-dimensional coordinates. In other words, the events (spikes) are accessible based on a C, I, J index, where C represents a channel, and I, J represents indices into the two dimensional spatial coordinates of the image data.

The next block has the filter memory and kernel, where the filter memory stores the weights (parameters) for the convolution operation.

The next block performs the convolution operation, including the summation, to provide the final result. In an embodiment, the convolution uses an efficient hardware implementation, with a resulting reduction in memory requirement and also a reduction in the number of neurons necessitated on a layer within the neural network. Such reductions result in the fan-in and number of filters forming the overall limitations of the network.

The efficient hardware implementation is made possible by the order in which the data from an input packet is provided. This order enables each calculation to focus on a row-by-row calculation. Thus, the net effect of this efficient ordering is that following the completion of one row, the next stride in the operation is one row down. Thus, rows may be reused for the next input row spikes. The net effect is that the top row is no longer needed in the computation, and therefore only a small amount of memory is necessary for storage of the potential. In summary, instead of having to store the entire set of potentials, the ordering means that only storage for one buffer is needed, which is a big reduction in the memory requirement at each convolution neural processor. The result from one computation is then forwarded to the next convolution neural processor.

Figure 9:
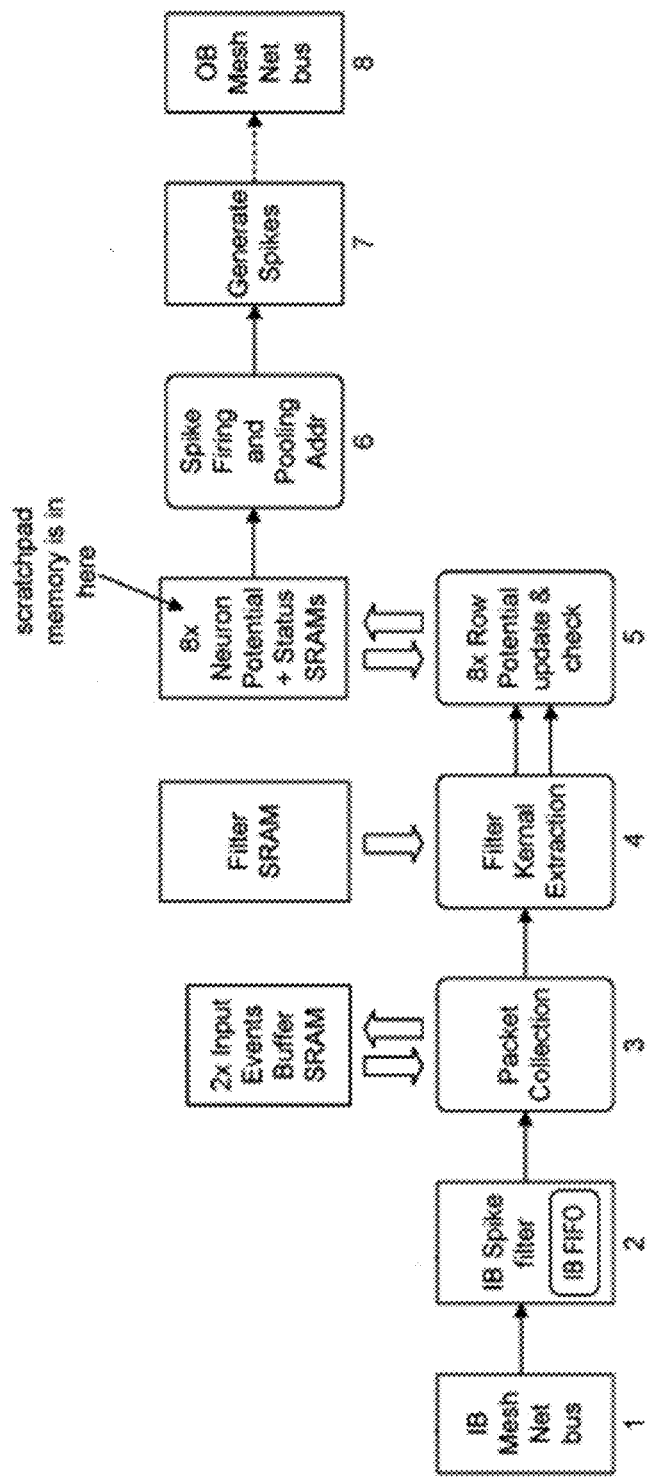
FIG. 9 illustrates the main steps to process spikes in a packet, in accordance with an event-based convolution.

More details are illustrated in FIG. 9, which shows the main steps of performing an event-based convolution. In step 1, the inbound (IB) mesh delivers events from other cores. Events are filtered out if the x, y location is not found on the current CNP in step 2. If the event x, y location does belong to the CNP, then its x and y coordinates are transformed to local CNP coordinates when necessary. In step 3, all events are collected until an end of packet (EOP) signal is received. If ping-pong buffers are used, the input events buffers are swapped when the EOP signal is received. Note that the second part of the pooling operation (row pooling) is also done in this step. Column pooling was done before the events were sent. Both row and column pooling are only done when the max pooling operation is associated with the output of a particular layer. Thus, some layers perform pooling operations while others do not.

In step 4, the channel of the event is read and is used as an offset address to index into the filter SRAM (where the weights are stored). Next, all filter kernels corresponding to the event's channel are copied from the filter SRAM memory. This can be done because of how the filters are arranged in the filters SRAM. This is shown in FIG. 10.

Figure 10:
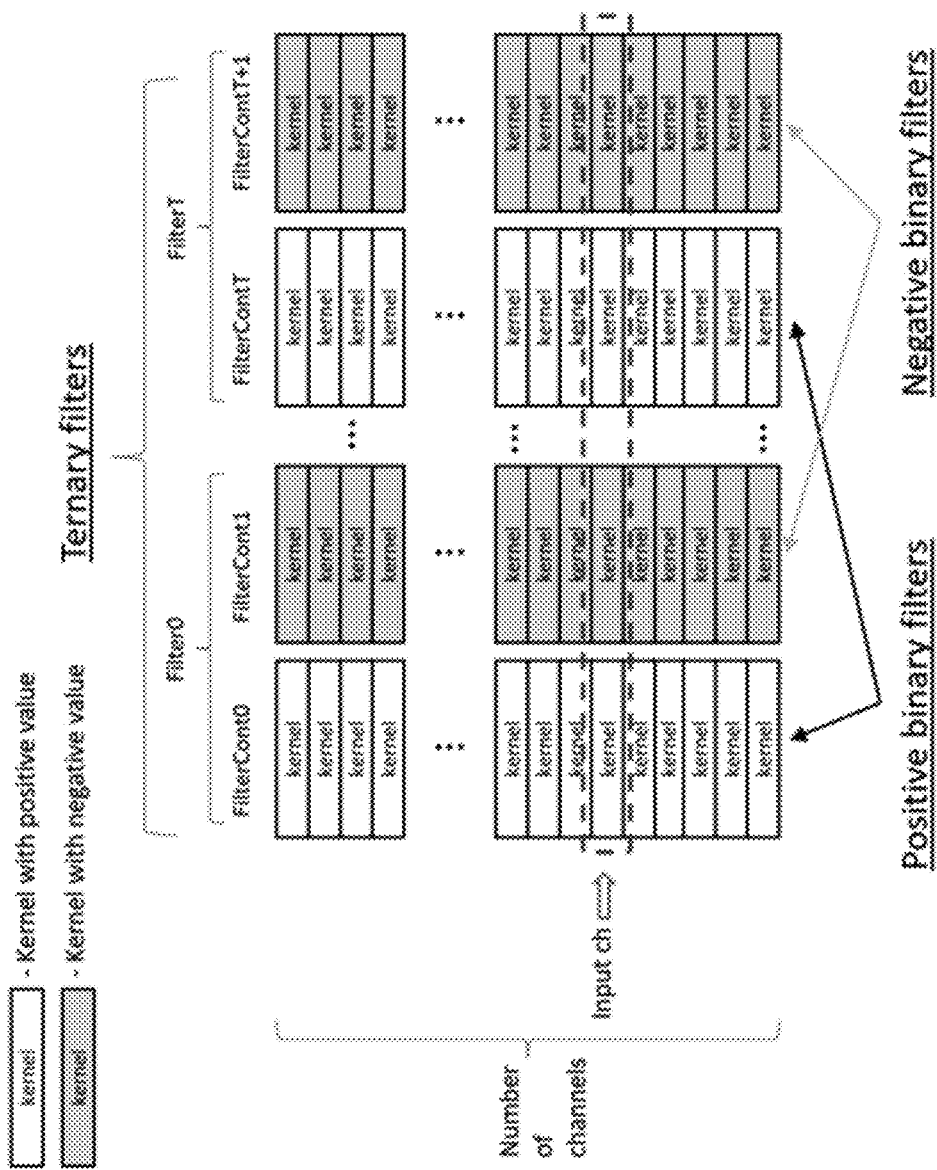
FIG. 10 illustrates a filter SRAM layout example for ternary filters or binary filter configurations.

FIG. 10 shows a filter SRAM layout example for ternary filters or binary filter configurations. For both ternary and binary filters, positive and negative values are separated into different filters. The same is true for multibit filter values (not shown). The important thing to note is that the filters, which contain the weights for the neural network, are arranged by channel in the filter SRAM memory. This configuration allows the hardware to quickly index (find) the correct filter kernels based only on the input channel. Because the filter kernels are arranged contiguously in memory, they can be efficiently copied to the neural processing engines for the convolution calculation.

Because filters may be spread across multiple CNPs, the start and ending filter indices are calculated. Each neural processing engine processes a single filter at a time. Thus, the first 8 filters in the CNP will be processed by the 8 neural processing engines. The 8 neural processing engines now have the appropriate filter kernel addresses and can perform the following operations in step 5:

1) Each neural processor initializes (zeros out) potentials in scratchpad memory. The scratchpad memory is arranged in 8 rows of 64 columns, leading to the temporary storage of 512 20-bit potentials. Potentials in scratchpad memory are arranged in row major order, so column entries are contiguous in memory.
2) Input events are read from the input events buffer in x, ch, y order. This allows the neural processing engine to process all the events related to a single potential at a time.
3) Neural processors begin processing events. Each engine:
   a. Gets the first event's channel and loads the 1×1, 3×3, 5×5, or 7×7 kernel that corresponds to:
      i. the filter the current neural processing engine is working on
      ii. the channel from the event.
   b. Finds the rows of the kernel that are non-zero.
   c. Loads a single non-zero kernel row
   d. Calculates the potential and output event SRAM addresses of each row using the inverted kernel format (see FIG. 6).
   e. Multiplies all kernel row elements by event value (1-4-bit value)
   f Increments the corresponding potentials by the product using addresses from part d.
   g. After all events have been processed for the current filter, transform potential to an output activation (event)
   h. If the output activation is non-zero, update the status fire array with a true or 1 entry. This array is a list of neurons that have fired and whose activation values must be sent to the next layer.

Figure 11:
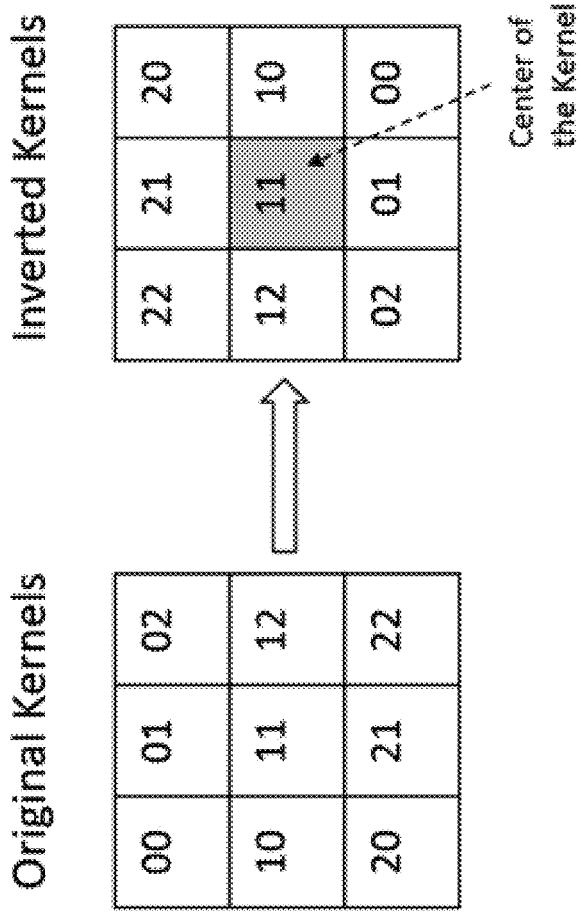
FIG. 11 illustrates inverted kernels.

FIG. 11 illustrates inverted kernels. The neural processing engines use the inverted kernel element positions with the event's local x, y coordinates to find the address of the potentials that must be updated. The filter kernels must be stored in the inverted kernel format to allow the neural processing core to quickly calculate the potential's address.

Figure 12:
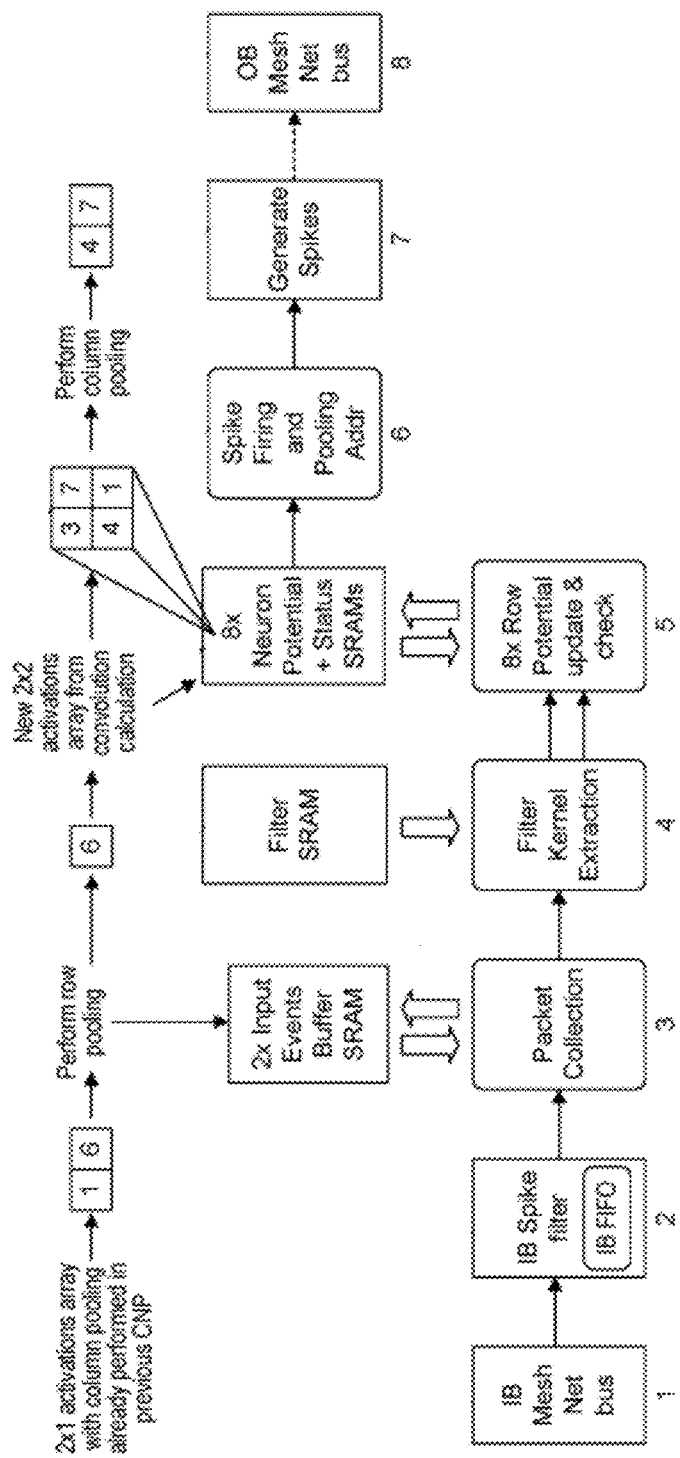
FIG. 12 illustrates a hardware architecture and flow diagram to implement event-based convolution in hardware.

Step 6 consists of checking the status fire array to see if a neuron has fired and calculating the neuron's x, y, ch. If pooling is enabled in this layer, then the column-wise component of pooling is done at this time. Here it is important to note that implementing the max pooling operation (see Glossary) in two-steps is efficient from a computational standpoint. FIG. 12 shows the steps where the max pooling operations are being performed. Step 7 converts the activation event x, y, ch coordinates local to the CNP to global network coordinates and finds all NPs to deliver the event to. Finally, at step 8, the event is sent through the routing mesh to the relevant NPs.

FIG. 12 shows an example of a 2×2 max pooling operation being performed. At step 3, row pooling is performed on a 1×2 activations array to produce a single 1×1 activation that is used during step 4 to compute the convolution. Step 5 produces a new 2×2 activations array. Step 6 performs column pooling to reduce the 2×2 activations array to a 1×2 activations array.

The 2×2 max pooling operation is performed in two parts; where row pooling is done on step 3 and column pooling is done on step 6 of the event-based convolution algorithm.

Performing row pooling on step 3 is efficient because both elements (activations) of the row are sent whenever they are calculated. If one of the elements is already present in the input events buffer, the second element need only compare itself with the current element to see if it is greater than it. If it is, then it simply overwrites the current element with its own value. This allows the hardware to perform row pooling in an asynchronous manner.

Performing column pooling on step 6 allows the CNP to send only half of the 4 possible elements across the mesh network. This reduces event traffic on the mesh network.

The filters, which contain the weights for the neural network, are arranged by channel in the filter SRAM memory. This configuration allows the hardware to quickly index (find) the correct kernels based only on the input channel. The contiguous sorting of the kernel filters by channel also allows them to be efficiently copied from the filter SRAM to the 8 neural processor engines that perform the convolutional operations.

During step 5 when the convolutions are being computed within each neural processor engine, filter kernels are stored in inverted kernel format so the coordinates of the affected neurons (i.e. their potentials) can be quickly calculated.

The description next discusses some possible figures of merit (or ways to possibly compute them) for the design of the event-based convolution in the CNP. The initial idea for a figure of merit was based on the relationship between the size of an input image with dimensions M×N×C, where M is the height of image, N is the width of the image, and C is the number of channels of the image (this will usually be 3 for color images), the total number of events across the image, and the speed with which a convolutional operation can be performed over the image.

Developing a figure of merit that is centered on efficiency or power consumption seems appropriate. To do this, one first defines a synaptic operation (SO) as an addition or decrement of an integer to another integer value that represents the neuron potential. The power calculations (not shown) suggest that the hardware spends 5 pJ/SO (picojoules per synaptic operation). This is a measure of efficiency and is independent of the network structure or the input data but specific to the CNP design. The more efficient the hardware is, the smaller this number is. This number varies slightly for different convolution kernel sizes, but the choice is something close to the worst case. Thus, the figure of merit is for a system that performs event-based convolutions with an efficiency of 5 pJ/SO. It may be possible to pair this figure of merit with the previous figure of merit as they are both for event-based convolutions.

Figures of Merit for Unsupervised Learning Rule

The proposed unsupervised learning rule is made up of a collection of simple, but significant modifications to the conventional learning rule. In short, the novel unsupervised learning rule is the application of the conventional learning rule to the convolutional connection topology in place of the fully-connected layer topology for which conventional learning rule was developed, with additional modifications to ensure the same pattern isn't learned too often. The original conventional algorithm is first described and then the changes are described that allow the conventional learning rule to be applied to convolutional connection topologies.

M inputs with the caveat that each of the neurons may have only W connections (weights) with a value of 1 and M−W connections with a value of 0. To form a packet, you allow N unique events to be placed into a bit-array of length M and represent the presence of an event with a '1' entry and the absence of an event with a '0' entry as is shown in Table 1.

TABLE 1

A single event packet with M = 14 and N = 4.

| Event # | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| State | 0 | 0 | 1 | 0 | 1 | 0 | 0 | 0 | 0 | 1 | 0 | 1 | 0 | 0 |

Each neuron 'processes' a packet by computing the number of common events between W (a neuron's weights) and the input packet. This computation is efficient because it can be done using a logical bit-wise AND function. The number of matches is the neuron potential. Table 2 shows the matches found in red. Each neuron has a different firing threshold ($T_{Fire}$) that acts as an activation function because it transforms the potential into a binary activation.

TABLE 2

The weight arrays of 3 neurons is shown processing a packet (W = 3). The matches are in bold/italics. The number of matches is the value of the potential shown in the last column.

| Event # | 1 | 2 | 3 | 4 | 5 | 6 | 7 | 8 | 9 | 10 | 11 | 12 | 13 | 14 | |
|---|---|---|---|---|---|---|---|---|---|---|---|---|---|---|---|
| State | 0 | 0 | 1 | 0 | 1 | 0 | 0 | 0 | 0 | 1 | 0 | 1 | 0 | 0 | Pot. |
| Neuron 1 | 0 | 1 | *1* | 0 | 0 | 0 | 0 | 0 | 0 | 0 | 0 | 0 | 0 | 0 | 1 |
| Neuron 2 | 1 | 0 | *1* | 0 | *1* | 0 | 0 | 0 | 0 | *1* | 0 | 0 | 0 | 0 | 3 |
| ... | | | | | | | | | | | | | | | ... |
| Neuron 3 | 0 | 0 | 0 | 1 | 0 | 1 | 0 | 1 | 0 | 0 | 0 | 0 | 0 | 0 | 0 |

The conventional unsupervised learning rule finds repeating patterns in data. It is robust to noise and often only requires the pattern to be repeated 2-5 times. The conventional rule can perform dimensionality reduction because neurons learn to become sensitive to only a single pattern and therefore only send a few events indicating whether a particular pattern has been detected. The conventional learning rule detects patterns because the conventional learning rule can only detect a pattern within a packet, which is a collection of events that are close to one another in time. The conventional learning rule assumes binary synapses (weights) that can be either 0 or 1 and binary or ternary activations that can have values of either 0, 1, and in the ternary case, −1. The descriptions will consider the binary weights/binary activations case.

At its core, the conventional learning rule consists of M classes of inputs arranged in a packet of events of length N. N must be less than M. One next connects P neurons to all The conventional learning algorithm is as follows. After all neurons have computed their potentials, each compares its potential to both $T_{Fire}$ and the learning threshold, $T_{Learn}$. As mentioned previously, a neuron's output is set to 1 when its potential is over $T_{Fire}$. Whenever a neuron's potential is over $T_{Learn}$, the 'weight swapping rule' is initiated. According to this rule, a certain number of their unused weights, $n_{swap}$, are moved to active but unused inputs. Both unused weights and unused inputs are chosen randomly. Unused weights are defined as weights that have a '1' in a position that has a corresponding '0' in the input packet. Unused inputs are defined as those inputs that have a '1' in a position that has a corresponding '0' in the weight array. For instance, in Table 2, Neuron 1 has an unused weight at position 2 because there is a '1' entry in the weights array but the corresponding input packet entry is '0'. Additionally, input event 5 is an unused input when compared with Neuron 1's weight array. The effect of this learning is to gradually make a neuron's weight array more similar to an input pattern that is repeated over time. The neuron's weights are initialized randomly. This allows different neurons to look for different patterns. Of equal importance is the fact that the number of non-zero weights W stays constant during the learning process. This is critical for unsupervised learning rules because without a homeostatic process (i.e. the constancy of W), the learning rule can easily become unstable and much more difficult to use.

The learning rate, $n_{swap}$, and the learning threshold, $T_{Learn}$, are varied independently for each neuron. When learning begins, a low $T_{Learn}$ is necessary to begin moving the weights. As learning progresses, the potentials caused by the repeating patterns tend to increase. This means that $T_{Learn}$ can slowly be increased to decrease the false alarm rate without missing the patterns. At this point, it's also useful to increase $n_{swap}$ until $n_{swap}=0$. At this point the neuron would no longer learn new patterns. The equations used to adjust $T_{Learn}$ and $n_{swap}$ are as follows:

$$T_{Learn} = \min(T_{max}, \text{potential})$$

$$n_{swap} = \min(n_{min}, n_{swap} - dn_{swap} * (\text{potential-} T_{Learn}))$$

Where $dn_{swap}$ is a parameter that tunes how fast the learning rate is decreased.

Before describing the unsupervised learning rule, one needs to define a few terms. FIG. 13 describes event-based convolution using the filter and neuron terms. A filter is a 3D collection of weights (shown in blue) while a neuron is the specific application of a single filter to a specific spatial location of the inputs. A single filter will be applied to every spatial location of the inputs and generate an entire plane of neuron potential entries. During the discussion of the unsupervised learning rule, it is important to understand the distinction between these two concepts.

A filter is a 3D collection of weights that has spatial and channel extent. Each filter has a different set of weights. The filters are denoted in blue and have dimensionality 3×3×3 (height=3, width=3, channels=3). Neurons can be defined as filters applied to a specific x,y location of the input as shown at the bottom half. A single neuron has a single entry in the potential array shown in light orange. Each plane of potentials array is generated when a single filter is applied (centered) at every spatial location of the inputs. The single neuron entry in gray in the potential array was calculated from filter 1's weights applied to the location of the input denoted in the lower left display of the input. The dotted red line denotes the receptive field of the neuron centered at the event.

The present unsupervised learning rule can be described as being based on a conventional learning rule, with the following key changes:
  (1) the conventional learning rule allows any neurons over their learning threshold, $T_{Learn}$, to learn. The novel unsupervised learning rule only allows one neuron per filter to learn. An additional modification restricts the number of neurons in a layer that can learn to just one;
  (2) during the weight-swapping, the input events are filtered to include only those events relevant to the specific neuron undergoing learning; and
  (3) the algorithm supports pseudo-supervised learning to allow neurons to learn different patterns.

Change 1 (Limiting Neurons Allowed to Learn)

Recall that a single filter is applied at every spatial location of the input. The number of neurons per filter allowed to learn at a single event packet must be reduced to one. This is because all neurons for a single filter share a single set of filter weights. The convolutional operation is what allows the system to search for the same pattern at every spatial input location. If the algorithm can find the pattern at any spatial input location, then the algorithm is said to be translation invariant. To preserve translation invariance, only one spatial location (neuron) per filter should be allowed to learn per input packet.

Of additional note is that the current implementation further limits the number of neurons allowed to learn on a single event packet to one per CNP. After some experimentation, it was found that neurons still learned repeating patterns quite quickly.

Change 2 (Filtering Input Events During Learning)

Once a neuron has been selected to learn, the weight swap rule is applied to:
  (1) the weights corresponding to the neuron's filter; and
  (2) only the subset of input events that overlap with the receptive field of the neuron's position.

The subset of input events that overlap with the receptive field of the neuron's position are shown in FIG. 13. The events that fall within the dotted-red line are the events that will be used during the learning rule weight swap. Note that the dotted-red line in FIG. 13 extends to all channels and not just the current channel. In the FIG. 13 example, this means that filter 1, which has size of 3×3×3, has 27 weights and the 27 corresponding input events will be used during the weight-swapping portion of the learning rule. One can see that the 3×3×3 weights and inputs can be flattened into two 1×1×27 linear bit arrays. The original conventional learning rule weight swapping algorithm can now be applied to these bit arrays.

Change 3 (Pseudo-Supervised Learning and Competition)

Unsupervised learning algorithms often suffer from a redundancy issue. Without a mechanism to either consolidate similar patterns or allow neurons that represent similar patterns to compete with or inhibit one another, you can easily have many neurons find and learn the same pattern. This is wasteful and should be avoided. The conventional learning rule had no mechanism to prevent this. Pseudo-supervised learning solves this problem by breaking filters into different groups and associating a group label with each filter group. When an input event packet is presented, a group label is presented along with it. Only filters within the group that has the same label as the input event packet are eligible to learn from the input event packet. This allows different groups of filters to be assigned to different input event packet labels. Note that it is still possible for filters (and neurons) within a group to learn the same pattern. However, the user now has a mechanism to plan for how much redundancy to allow for a given set of input event packets. This is a significant improvement on the efficiency of the conventional algorithm.

The present system and method performs unsupervised learning on an event-based convolutional neural network architecture. Two components that are combined into a unique system and method are:
  (1) an unsupervised learning algorithm on a device; and
  (2) an event-based convolutional neural network with the learning algorithm simultaneously on that same device.

Winner Takes All

Winner Takes All (WTA) picks at most one winning feature for each location. In a large field of features, too much relevant information may be discarded. Without WTA, the best fitting features at a location will still spike, but they will also be accompanied by spikes of lesser fitting features. Those lesser fitting features cost power and processing time. By applying WTA in strategically chosen groups, the lesser fitting features can be eliminated while retaining all of the best fits.

The power consumption and processing speed of an SNN is strongly tied to the sparsity of spikes in a SNN. The purpose of the present invention is to reduce the number of propagated spikes by strategically grouping the filters from each location in the input stream and applying a WTA technique on those groups. The context of the K-WTA hardware implementation is shown in FIG. 14. The WTA grouping can be hand designed if the kernels are a pre-defined structure, or a clustering algorithm can be used to define the groups with similar or dissimilar features. The sizes of the groups can vary in size (FIG. 15).

The K-WTA can operate in multiple modes. FIG. 16 illustrates how the winners are chosen in the "Best Offer" form.

For some features, it is only necessary to know that any one of the potentials in a group is above threshold. This will be the case for dissimilar features where only one of the features is expected to be above threshold. In this case, the processing speed can be increased and the power reduced by only processing filters in a group until any one of them is above threshold. In order to reduce bias, the order of potentials in each group are changed for each pass. FIG. 17 is an example of K-WTA in "First Good Offer" mode.

For context, FIG. 18 shows how an embodiment of this scheme could fit into an Spiking Neural Network architecture. The block diagram for an embodiment that generates the filter results input to the WTA block is shown in FIG. 19.

The present system and method are also arranged to carry out event-based transposed convolution on an input event array that has the effect of upsampling the input array to an output array having a desired resolution. Upsampling an input event array in this way can be useful in semantic segmentation and super-resolution applications. The present system and method are also arranged to carry out event-based dilated convolution and training data augmentation.

It will be understood that the present system and method are implemented with minimum hardware changes compared to the implementation described in relation to FIGS. 1 to 19. Importantly, the spiking neuron circuits that implement event-based standard convolution functions (for object detection) are additionally also used to implement the present event-based transposed convolution. The event-based transposed convolution implementations (on neuromorphic hardware) will reduce power consumption when compared to known techniques.

In the examples described below, a transposed convolution operation is performed by first carrying out a transformation operation on an input event array so that the input event array is appropriately sized for production of an output array of desired resolution.

FIG. 20 shows a hardware architecture and flow diagram according to an embodiment of the invention, the architecture and flow diagram for implementing event-based convolution in hardware, including event-based transposed convolution described below; and/or event-based dilation convolution and/or data augmentation described subsequently. The hardware architecture and flow diagram shown in FIG. 20 is similar to the hardware architecture and flow diagram shown in FIG. 12, except that transformation functionality 2002 is added to carry out transformation operations on the input event array and/or the kernels when transposed convolution or dilated convolution is performed. The transformation functionality 2002 may be implemented using a dedicated transformation component or using any one or more component of the neuromorphic chip.

In some embodiments, the transformation operation carried out on an input event (spike) array is performed in accordance with a transposed convolution process by adding zero locations to the edge of the input event array (padding) or by dilating the input event array. A dilation operation is a type of transformation that changes the size of a data array by adding zero locations between locations of the array, with the resultant size depending on a dilation factor. If the dilation factor is more than 1, the size of the data array is increased. If the dilation factor is less than 1, the size of the data array is reduced.

In addition or alternatively, embodiments may include performing a transformation operation on the or each kernel in accordance with a dilated convolution process by dilating the kernel(s) (or 180-degree rotated kernel(s)). Using dilated kernels to perform event-based convolution is effective since it incorporates surrounding context by enlarging a receptive field size using a relatively small number of parameters. Advantageously, more memory efficient and/or advanced AI-applications can be implemented.

In some embodiments, the transformation functionality 2002 is implemented by a spike converter that receives input data/kernels in their native format and converts them for further processing by the neural processor(s).

In some embodiments, the spike converter is part of a neuromorphic chip, but not part of a neural fabric (mesh that includes the processor(s)) of the chip. In such a case, the neural fabric receives the dilated input and performs event-based convolution as described in the earlier embodiments to determine a convolved output, which represents an event-based transposed convolved output; or receives a dilated kernel and performs event-based convolution as described in the earlier embodiments to determine a convolved output which represents an event-based dilated convolved output.

In some embodiments, the transformation functionality 2002 is part of the neural fabric and therefore the transformation functions are performed in the neural fabric.

In some embodiments, the transformation functionality 2002 is a part of a separate neuromorphic system, for example running on a separate device with one or more processor(s) or a cloud network (server).

In some embodiments, all operations and components shown in FIG. 20 are performed on a neuromorphic chip.

Before describing event-based transposed convolution, classical convolution and event-based convolution that does not involve transposed convolution will first be described with reference to FIG. 21 which shows a diagrammatic representation of classical convolution 2101 and event-based convolution 2103.

In the classical convolution example 2101, a 5×5 input array 2105 zero-padded (not shown) with a 1×1 border is convolved with a 3×3 kernel 2107 to produce an output array 2109. Since to perform convolution, one function require inversion, the kernel is 180-degree rotated. The 180-degree rotated kernel is used to perform MAC operations with the input array 2105. The MAC operation is performed at each position of the input with stride 1, to achieve convoluted output 2109.

As discussed above in relation to FIG. 8, event-based convolution reduces the number of multiply and/or accumulate operations (MAC operations) compared to classical frame-based convolution, since generally the input array is sparse and does not include non-zero events at each address in the array. It will be understood that the input array may comprise data that is provided to the network during training or during inference, or that is output from a previous layer of the network.

In the event-based convolution example 2103, MAC operations are performed between a 5×5 input array 2102 (in this example, 1-channel) and a 3×3 kernel 2104 (and not between the input and the 180-degree rotated kernel, which is the case in classical approach described earlier). Furthermore, the MAC operation are not performed at each position of the input, however, only at the positions where events (non-zero spike values) exist. This event-based convolution technique is described further in detail.

It will be understood that if a relatively large size image is fed to the network during training or inference, multiple neural processors may be used to implement event-based convolution, with each neural processor acting on a different part of the image. Referring to FIG. 5, in this example, each neural processor is configured to identify relevant spikes designated to it, and to perform event-based convolution in hardware on an input array including identified relevant spikes.

During event-based convolution, the convolution neural processor identifies relevant events in the input array, in the present example first, second and third non-zero spike values 2106, 2108 and 2110, and implements MAC operations only in relation to the identified non-zero spike values 2106, 2108 and 2110. In the illustrated example, the non-zero spike values 2106, 2108 and 2110 are respectively located at three address locations (1, 2), (2, 2) and (2, 1). In some embodiments, multiple convolution neural processors (e.g. shown in FIG. 5) are configured to identify relevant events (non-zero spike values) in the input array and implement MAC operations only in relation to the identified events (non-zero spike values).

The calculations performed during the event-based convolution example will now be described. It will be understood that these operations are performed by spiking neuron circuits of the neural processor on neuromorphic hardware.

For the first spike value 2110 at address location (2,1), each value of the kernel 2104 is multiplied by the first spike value (1) and the resultant 3×3 matrix is placed at address (2,1) of a 5×5 zero matrix to produce a 5×5 first matrix 2118.

For the second spike value 2108 at address location (2, 2), each value of the rotated kernel 2104 is multiplied by the second spike value (2) and the resultant 3×3 matrix is centered at address location (2,2) of the first matrix and summed with the first matrix 2118 to produce a 5×5 second matrix 2120.

For the third spike value 2106 at address location (1, 2), each value of the rotated kernel 2104 is multiplied by the third spike value (1) and the resultant 3×3 matrix is centered at address location (1,2) of the second matrix 2120 and summed with the second matrix 2120 to produce a 5×5 third matrix 2122.

The third matrix 2122 represents the event-based convolved output in this example, which is noted to be same as the convolved output achieved by the classic frame-based convolution example 2102.

It will be appreciated that memory can be configured to store kernels in standard format or 180-degree rotated format, as the neural processor can simply produce the required kernel format for processing by rotating stored standard kernels on-the-fly if necessary.

In at least some embodiments, the above-described standard event-based convolution process is also used to implement event-based transposed convolution by first transforming the input event (spike) array, for example by dilating the input array.

Examples of transposed convolution that has the effect of upsampling an input array are shown in FIGS. 22(*i*), 22(*ii*) and 22(*iii*).

FIG. 22(*i*) illustrates frame-based transposed convolution of a 2×2 padded input array using a 3×3 kernel and a unit stride. The padding is added to the outer frame of the input array so that the desired size/resolution output is produced. As a result of this operation, a 2×2 input is converted to a 4×4 output, thereby achieving upsampling of the input.

FIG. 22(*ii*) illustrates dilated input transposed convolution. In this example, the input is a 2-dilated 2×2 array with an added 2×2 zero border padding to obtain a transformed 7×7 input array. After carrying out the transformation step on the input array, a convolution operation is performed using a 3×3 kernel to produce a 5×5 transposed convolved output.

FIG. 22(*iii*) illustrates a further example of a dilated input transposed convolution. In this example, the input is a 3×3 dilated array with an added 1×1 padding border to obtain a transformed 7×7 input array. After carrying out the transformation step on the input array, a convolution operation is performed using a 3×3 kernel to produce a 5×5 transposed convolved output.

To implement event-based transposed convolution in the present embodiments, the transformation functionality 2002 shown in FIG. 20 is used to receive input event (spike) arrays and transform the input arrays, for example using padding and/or dilation. After transforming an input array, event-based convolution as described above, for example in relation to FIG. 21, is carried out to obtain an event-based transposed convolved output. The event-based transposed convolved output may be used by the neural processor to implement other functionality, for example for semantic segmentation or super-resolution processing purposes.

One advantage of implementing event-based transposed convolution is to achieve reusability of the spiking neuron circuits, which will reduce the size and cost of the neuromorphic hardware (e.g. a chip). In other words, the neuromorphic hardware is optimized to implement a diverse variety of use cases by effectively reusing the spiking neuron circuits available on the hardware.

A specific example of an event-based transposed convolution using input array dilation is shown in FIG. 23.

As shown in FIG. 23, an example 4×4 input event (spike) array 2302 includes non-zero events 2312, 2314, 2316 at respective spatial coordinates (1,0), (2,1) and (0,3). The input array 2302 is transformed using the transformation functionality 2002 to a dilated input array 2304 that includes non-zero events 2316, 2318, 2320 at respective coordinates (3,1), (5,3) and (1, 7). Padding is also applied to the input array 2302 so that a top and side of the transformed array is padded with zeros. After dilation and padding of the input array, event-based convolution is carried out on the transformed input array. In this way, even though the input array has increased in size, no additional processing cost is incurred because only the non-zero events are processed during event-based convolution.

In the present example, the input array is 2-dilated (with 1×1 padding to the top and side) to produce an 8×8 transformed input array 2304. However, it will be understood that other dilation arrangements may be used, depending on the desired output array upsampling characteristics. For example, the input array may be 3-dilated, 4-dilated, and so on, and may include different padding arrangements.

In some embodiments, for 2-dilated event-based transposed convolution with padding as shown in FIG. 23, the spatial coordinates of the non-zero events in the output array may be calculated using the following function:

$$X(\text{new}) = 2 * X(\text{old}) + 1$$

$$Y(\text{new}) = 2 * Y(\text{old}) + 1$$

In some embodiments, each transformed input array is stored and subsequently used by the neural processor by reading the transformed array during the event-based convolution processing, although this may not be memory efficient as it may require additional memory to store the transformed input arrays.

Referring to the example in FIG. 23, after transformation of the input array 2302 using dilation and padding, event-based convolution, for example as described in relation to FIG. 21, is performed to produce an event-based transposed convolved output. As depicted in FIG. 23, MAC operations are performed only for 3 non-zero first, second and third spike input values 2316, 2318, 2320 using a kernel 2306.

For the first spike value 2316 at address location (3,1), each value of the rotated kernel 2306 is multiplied by the first spike value (1) and the resultant 3×3 matrix is placed at address (3,1) of an 8×8 zero matrix to produce an 8×8 first matrix 2308.

For the second spike value 2318 at address location (5,3), each value of the rotated kernel 2306 is multiplied by the second spike value (1) and the resultant 3×3 matrix, centered at address location (5,3) of the first matrix 2308 is summed with the first matrix 2118 to produce an 8×8 second matrix 2310.

For the third spike value 2320 at address location (1,7), each value of the rotated kernel 2306 is multiplied by the third spike value (1) and the resultant 3×3 matrix, centered at address location (1,7) of the second matrix 2310 is summed with the second matrix 2310 to produce an 8×8 third matrix 2322.

The third matrix 2322 represents the event-based transposed convolved output in this example.

It will be appreciated that in this example a 4×4 input array (2312) is up-sampled to an 8×8 array (2322) after performing the event-based transposed convolution operation. Advantageously, the event-based transposed convolution reduces the computation and power requirement of the system due to the smaller number of MAC operations required compared to non-event-based transposed convolution, and a smaller number of spiking neuron circuits are required to perform this operation.

In some embodiments, the type of dilation (2-dilation, 3-dilation, and so on) and padding of the input array is user controllable and configured when a neural network is initially configured. The transformation component 2002 can be part of the convolution neural processor or a separate processor/assembly working with the neural processor (fabric).

An example of a dilated convolution process using kernel dilation is shown in FIGS. 24 (*i*) and (*ii*).

FIG. 24(*i*)(*a*), FIG. 24(*i*)(*b*) and FIG. 24(*i*)(*c*) show examples of a 3×3 kernel that has been 1-dilated 2401, 2-dilated 2402 and 4-dilated 2406 respectively. In a similar way to dilation of an input array discussed above in relation to FIGS. 22 and 23, dilation of a kernel increases the size of a kernel by inserting zero gaps between the kernel elements.

FIG. 24 (*ii*) illustrates frame-based dilated convolution 2408 of a 7×7 input array using a 3×3 kernel that has been transformed to a 5×5 kernel using 2-dilation.

A specific example of event-based dilated convolution using kernel dilation is shown in FIG. 25.

In this example, the dilated convolution process is implemented using the transformation functionality 2002 shown in FIG. 20 to dilate the kernels, although it will be understood that the dilated convolution process may be implemented by any component of the neuromorphic chip. After dilating the kernels, event-based convolution as described above, for example in relation to FIG. 21, is carried out to obtain an event-based dilated convolved output.

Referring to FIG. 25, a 3×3 kernel 2502 is dilated (in this example, 2-dilated) to produce a 5×5 dilated kernel (2506). After dilation of the kernel 2502, event-based convolution, for example as described above in relation to FIG. 21, is performed on an input (spike) array 2504 to produce an event-based dilated convolved output 2512. As shown in FIG. 25, MAC operations are performed only at 2 non-zero first and second spike input values 2508, 2510 using the transformed rotated kernel 2506. Advantageously, event-based dilated convolution reduces the computation and power requirement of the system due to a smaller number of MAC operations and requires a smaller number of spiking neuron circuits to perform the operation.

For the first spike value 2508 at address location (1,0), each value of the rotated kernel 2502 is multiplied by the first spike value (1) and the resultant matrix values that coincide with a valid matrix location are placed in a 4×4 zero matrix centered at address (1,0) to produce a 4×4 first matrix 2511.

For the second spike value 2510 at address location (2,1), each value of the rotated kernel 2502 is multiplied by the second spike value (1) and the resultant matrix values that coincide with a valid matrix location are summed with matrix values of the first matrix 2511 centered at address (2,1) to produce a 4×4 second matrix 2512.

The second matrix 2512 represents the event-based dilated convolved output in this example.

It will be appreciated that in this example the event-based dilated convolution process creates a 4×4 output array based on a 4×4 input array 2504, and in this way the size of the array remains the same. Advantageously, the event-based dilated convolution reduces the computation and power requirement of the system due to the smaller number of MAC operations required compared to non-event-based dilated convolution, and a smaller number of spiking neuron circuits are required to perform this operation.

In some embodiments, to perform event-based convolution using dilated kernels, the kernel (or 180-degree rotated kernels) are dilated on reading (on 180-degree rotated reading) from SRAM. That is, kernels (or 180-degree rotated kernels) may be stored in SRAM in their compressed (nondilated form—2502), thereby optimizing both the number of kernels that can be stored and the energy required for lookup from memory. The kernels (or rotated kernels) are dilated (2506) on reading. Further, processing of the dilated kernels (or 180-degree rotated kernels) is optimized in this architecture because the all-zero rows are skipped in subsequent processing.

In some embodiments, the kernels (or 180-degree rotated kernels) are dilated and stored in dilated form such that when the kernels (or 180-degree rotated kernels) are read from memory by the neural processor, they are already dilated. This technique may not be as memory efficient as storing undilated kernels, since it may require additional memory to store the dilated kernels (or dilated rotated kernels).

In some embodiments, the type of dilation (2-dilation, 3-dilation, and so on) of kernels (or 180-degree rotated kernels) is user controllable and configured when a neural network is initially configured. The transformation component 2002 can be part of the convolution neural processor or a separate processor/assembly working with the neural processor (fabric).

It will be understood that other event-based convolution processes that involve transformation of the input array and/or of the kernel(s) are envisaged. For example, event-based transposed convolution may be carried out on an input array that has been padded but not dilated, or event-based convolution may be carried out based on a transformed input array and a dilated kernel.

The present method and system also includes data augmentation capability arranged to augment the network training phase by automatically training the network to recognize patterns in images that are similar to existing training images. In this way, feature extraction during feature prediction by the network is enhanced and a more robust network achieved.

Training data augmentation is a known pre-processing step that is performed to generate new and varying examples of original input data samples. When used in conjunction with convolutional neural networks, data augmentation techniques can significantly improve the performance of the neural network model by exposing robust and unique features.

Existing training data augmentation techniques, largely implemented in separate dedicated software, apply transformation functions to existing training samples as a pre-processing step in order to create similar training samples that can then be used to augment the set of training samples used to train a network. Typical transformations include mirror image transformations, for example that are obtained based on a horizontal or vertical axis passing through the center of the existing sample.

However, existing training data augmentation techniques are carried out separately of the neural network, which is cumbersome, expensive and time consuming.

According to an embodiment of the present invention, an arrangement is provided whereby the set of training samples is effectively augmented on-the-fly by the network itself by carrying out defined processes on existing samples as they are input to the network during the training phase. Accordingly, with the present system and method, training data augmentation is performed on a neuromorphic chip, which substantially reduces user involvement, and avoids the need for separate preprocessing before commencement of the training phase.

FIG. 26(*i*) illustrates an example input layer of a convolutional neural network that receives a 4×4 input 2612 and applies a convolution to the input using a 3×3 kernel 2610 (in this example with unit stride and no padding). The input 2612 is indexed by columns and rows such that a single column-row pair forms a coordinate of the input. As the input is convolved, features of the input data are extracted using 16 input layer neurons and 4 output layer neurons 2602, 2604, 2606, 2608. The input and output layer neurons each have an associated plurality of synapses defined using convolution topology. For example, neuron 2602 is only connected to input layer neurons associated with input coordinates (0,0), (1,0), (2,0), (0,1), (1,1), (2,1), (0,2), (1,2) and (2,2) since these are the only input neurons required for the MAC operation associated with a stride shown at 2615. The synapses are configured based on the values contained in the kernels. The membrane potential value achieved by each neuron 2602, 2604, 2606 and 2608 is represented by values at 2614, 2616, 2618 and 2620 respectively in a 2×2 convolved output 2613.

According to the present embodiment, the convolutional neural network is arranged, during a training phase, to augment the training data set of training input samples artificially by applying transformation operations to training samples as they are input to the network.

FIG. 26(*ii*) illustrates example data transformation operations that may be applied to an existing training sample 2630 by a transformation module, in this example in order to produce a 'flipped' sample 2632 wherein the transformed sample is a mirror image (based on a horizontal or vertical axis), a rotated version 2634 of the existing sample 2630, a translated version 2636 of the existing sample 2630, or a sheared version 2638 of the existing sample 2630 of the existing sample 2630. However, it will be understood that any suitable transformation function may be used.

In some embodiments, the transformation module transforms the input coordinates (x,y) to output coordinates using a transformation function selected from a set of transformation functions. Each transformation function may correspond to a different matrix function. For each function, x and y represent the coordinates of the input array, and $C_x$ and $C_y$ represent the coordinates of the center of the array. The coordinates are indexed starting from coordinate (0,0). The centers may be floating point numbers. For example, a (4×4) input could have center coordinates $C_x$=1.5 and $C_y$=1.5. If any transformation function result is a floating point number, it will be converted to an integer before being output as a coordinate. One way to do this is via truncation. For example, if a coordinate of 1.7 is produced during transformation, then the output coordinate will be 1. Another way is via rounding, for example such that if the floating point number produced is 1.7, the output coordinate will be 2. If a transformed coordinate of the input is out of bounds for the input layer (spiking neuron circuits), it will be ignored. If there is no input at a neuron coordinate, it will be treated as a non-event.

Example transformation operations will now be described in more detail.

1. Flip:

A 'flip' transformation operation is arranged to transform an input by creating a mirror image of the input about a vertical or horizontal axis passing through the center of the input. A horizontal flip operation transforms the input data such that a mirror image is produced about a horizontal axis passing through the center of the input. A vertical flip operation transforms the input data such that a mirror image is produced about a vertical axis passing through the center of the input. Various techniques could be implemented to perform flipping of spatial coordinates in this way. Example horizontal and vertical flip transformation functions are as follows:

a. Horizontal flip transformation function $= \begin{pmatrix} x - C_x \\ -y + C_y \end{pmatrix} + \begin{pmatrix} C_x \\ C_y \end{pmatrix}$ b. Vertical flip transformation function $= \begin{pmatrix} -x + C_x \\ y - C_y \end{pmatrix} + \begin{pmatrix} C_x \\ C_y \end{pmatrix}$ 2. Rotation:

A rotation transformation operation is arranged to transform an input by rotating the input about the center by θ degrees/radians.

Various techniques could be implemented to perform rotation of spatial coordinates. An example rotation function is as follows:

$$\begin{pmatrix} 1 & 0 \\ 0 & -1 \end{pmatrix} \left( \begin{pmatrix} \cos(\theta) & \sin(\theta) \\ -\sin(\theta) & \cos(\theta) \end{pmatrix} \begin{pmatrix} -x+C_x \\ y-C_y \end{pmatrix} \right) + \begin{pmatrix} C_x \\ C_y \end{pmatrix}$$

The above rotation operation will transform the input data such that it is rotates anticlockwise by a defined angle. This rotation is most effective when used to rotate square inputs by any 90° interval. However, it will be understood that the angle is not restricted to 90° increments, or square inputs. If a non 90° angle of rotation is used, and a floating-point value is produced by the function, the floating point value will be converted to an integer coordinate. This will be done using either truncation or rounding as described previously. If any output coordinate is out of bounds of the input layer (i.e. the coordinate does not correspond to any input layer neuron), then it will simply be ignored. If no input is received by an input layer neuron, it will be treated as a non-event. For example, if a (3×3) input is to be rotated anticlockwise by 80°, then the transformed output coordinate for the value at coordinate (0, 0) in the original input will be (1.81, 2.15), and thus the output coordinate via the transformation module will be either (1, 2) if truncation is used or (2, 2) if rounding is used.

3. Shear:

A shear transformation operation is arranged to transform the input data such that it is sheared horizontally by a factor of $S_H$ and vertically by a factor of $S_V$. Various techniques could be implemented to perform a shear transformation of spatial coordinates. An example shear function is as follows:

$$\begin{pmatrix} 1 & 0 \\ 0 & -1 \end{pmatrix} \left( \begin{pmatrix} 1 & S_H \\ S_V & 1 \end{pmatrix} \begin{pmatrix} -x+C_x \\ y-C_y \end{pmatrix} \right) + \begin{pmatrix} C_x \\ C_y \end{pmatrix}$$

If a floating-point shear factor is used, floating point values may be produced by the function. In this case, the floating-point value must be converted to an integer, for example using either truncation or rounding as described above.

4. Translation:

A translation transformation operation is arranged to transform input data such that it is translated horizontally by $T_H$ units and vertically by $T_y$ units. Various techniques could be implemented to perform translation of spatial coordinates. An example translation function is as follows:

$$\begin{pmatrix} x \\ y \end{pmatrix} + \begin{pmatrix} T_H \\ T_V \end{pmatrix}$$

One or more of these operations may be used in succession or combined to form more complex transformations. It will be appreciated that the transformation operations can be used for image or non-image data, such as sensor data.

FIG. 26(iii) illustrates an example input array that is transformed using a vertical flip transformation. As shown, the input coordinate (x,y) is transformed such that the value at the coordinate is moved to a new coordinate (x₂,y₂) that is a mirror image of the input coordinate (x,y) about a vertical axis passing through a center coordinate ($C_x,C_y$)

In some embodiments, the transformation operations are applied to an input by changing the connections between the coordinates of the input array and the input neurons. For example, as shown in FIG. 27(i), without transformation the coordinates of the input array are connected to the input layer neurons using a first pattern, and with transformation, as shown in FIG. 27(ii), the coordinates of the input array are connected to the input layer neurons using a different second pattern. The second pattern represents the desired transformation operation, in this example a vertical flip operation.

Other operations that transform the input data in order to produce modified versions of the input data for training data set augmentation purposes are also envisaged. For example, a transformation operation may be applied wherein selected data present in the input data is obscured, removed or modified, for example in order to simulate noise or distortion effects.

In one such transformation operation, the data in the input is masked or relevant input neurons are masked, controlled or otherwise arranged to prevent the data from being incorporated in the subsequent convolution operations. For example, selected input coordinates may be ignored, data associated with selected input coordinates may be zeroed, or new data could be added to an input coordinate, for example randomly, to simulate random noise, and/or to simulate particular color space manipulations by masking color channels. Such data changing operations may be carried out in addition to any one or more other transformation operation.

In addition or alternatively, a transformation could be applied directly to neurons in the input layer, for example to 'mask' selected neurons by preventing the selected neurons from receiving an input in response to reception by the network of a training data sample, such as by disabling sending of values to the relevant neurons in the input layer or discarding values as they are received at the relevant neurons at the input layer.

In some embodiments, the inputs to be masked or modified can be randomly or arbitrarily chosen or can be pre-defined. New input values, if any, assigned to the masked inputs can be randomly/arbitrarily allocated or allocated based on one or more predefined value(s) (e.g. a zero value). Random masking could be defined as blocking random sections of input that are spatially adjacent. The spatial shapes to be blocked, sizes of masked portions, number of masks, and the proportion of an image to be masked could be user defined or randomly decided. For example, this would emulate covering a portion of an image so that it is obscured or fed to the network with distortion. Randomly or arbitrarily blocking sections may increase robustness of a model, and in this way it may increase the likelihood of an object being correctly detected during inference even though it is partially obstructed.

In some embodiments, particular input samples and/or particular portions of input samples for blocking/masking/obscuring/modification are manually selected, although manually defining areas to be blocked can increase selective robustness in a model. An example of this transformation operation may enable more reliable prediction in more constrained environments, for example if an image of a face is provided for training a face recognition model, by blocking the lower part of the face the model can be trained to learn features required to recognize the person when they are wearing a mask.

In some embodiments, noise is introduced to an image by randomly masking and/or carrying out modification actions at particular input layer neurons.

In some embodiments, masking or data modification is applied selectively to one or more color channels to thereby perform color space transformations and enhance accuracy of a model during inference. For example, one or more input channel may be selectively masked to achieve color-space transformation. This may improve model performance by enhancing contrast between objects in the data. For example, if an objective is to detect sharks under water, removing the blue color channel could increase contrast between the water and the shark. Another application may be in the agricultural domain. For example, if an objective is to detect apples in an orchard, and red and green apple variants exist, it may be beneficial to remove the red color channel as it may prevent a model from learning the features of an apple based on color, and instead promote learning based on spatial features, thus making the model robust to color variations.

In some embodiments, masking is performed on multi-channel training data before the training data is provided to the input layer. In this case, masking is applied to each channel separately.

To implement masking and/or data modification, the neural processor is configured to randomly mask or modify particular input values and produce random inputs when the model is being trained on a sample data. In some embodiments, this operation is only performed by the neural processor in response to user input.

In some embodiments, the neural processor or any supplementary processor connected to the neural processor is arranged to receive user command or parameters that define the masking/data modification characteristics.

In some embodiments, the data on which masking is performed is image data or non-image data.

In some embodiments, in order to perform the desired transformation on the input data, the input layer may be reconfigured such that spatial coordinates for the input neurons are changed using a transformation module. An example of such an operation is shown in FIG. 27(*iii*), which shows transformation of each input layer neuron coordinate to a new coordinate. FIG. 27(*iv*) shows a sample input being passed to the newly reconfigured input layer. This technique is useful when it is desired to transform more than one data sample in the same way. For example, suppose if 'n' transformations per sample are to be created, the input layer will only need to be reconfigured once per augmentation, as opposed to once per sample per augmentation. Thus, reducing computational complexity from $O(m \times n)$ to $O(n)$ where 'n' is the number of augmentations per sample, and m is the number of samples.

It will be appreciated that the disclosed data augmentation technique produces a more robust machine learning model by effectively creating different training inputs using existing training data. Performing transformations on the data can create new samples for the model to train on, and varying the data through transformations can cover a larger input domain with limited samples. Advantageously, transforming the data creates new input samples, artificially creating different scenarios for the model to train on. This technique can also be used to create new samples while implementing one/low shot learning in the spiking domain.

In some embodiments, the above disclosed data augmentation technique is performed during inference, independently of whether train-time data augmentation technique is performed or not. The data augmentation is applied to a test data (e.g. input image) by transforming spikes or spiking neuron circuits, which result in processing of the spikes related to a flipped, a rotated, a sheared and/or translated image of an input image. Based on the processing, features are extracted and are classified for prediction.

In some embodiments, when spikes related to transformed image(s) are used for predictions, whichever class corresponding to a spiking neuron circuit is predicted most frequently amongst multiple spiking neuron circuits (of a classifying layer of a spiking neural network) representing various classes, is considered to be a winning class for the input data (e.g. input image) and predicted.

In some embodiments, when spikes related to transformed image(s) are used for predictions, whichever spiking neuron circuit has the highest membrane potential value more number of time (dominant class during inference for the input image and transformed image(s)), amongst multiple spiking neuron circuits (of a classifying layer of a spiking neural network) representing various classes, is considered to be a winning class for the input data (e.g. input image) and predicted.

A person skilled in the art will appreciate that the above embodiments that use transpose convolution, dilated convolution and training set data augmentation describe techniques for 1-channel data only, although it will be appreciated that the techniques can similarly be implemented with multi-channel data, for example that include red, green and blue colour channels.

A person skilled in the art will appreciate that when implementing the data augmentation-based embodiments for flipping, rotation, translation and shearing, all the spikes associated with an image are used when performing transformation.

A person skilled in the art will appreciate that when implementing event-based transpose convolution/dilated convolution and masking based data augmentation embodiments, the spikes of only a portion of an image could be used when performing transformation by a corresponding neural processor.

In some embodiments, one or more data augmentation techniques are implemented on a neuromorphic hardware without any user intervention.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

The foregoing description of the specific embodiments will so fully reveal the general nature of the invention that others can, by applying knowledge within the skill of the art (including the contents of the documents cited and incorporated by reference herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one skilled in the art.

While various embodiments of the present invention have been described above, it should be understood that they have been presented by way of example, and not limitation. It will be apparent to one skilled in the relevant art(s) that various changes in form and detail can be made therein without departing from the spirit and scope of the invention. Thus, the present invention should not be limited by any of the above-described exemplary embodiments, but should be defined only in accordance with the following claims and their equivalents.

It is to be understood that, if any prior art publication is referred to herein, such reference does not constitute an admission that the publication forms a part of the common general knowledge in the art, in Australia or any other country.

It will be understood to persons skilled in the art of the invention that many modifications may be made without departing from the spirit and scope of the invention.

What is claimed is:

1. A system, comprising:
a memory for storing data representative of at least one kernel;
a plurality of spiking neuron circuits;
an input module for receiving spikes related to digital data, wherein each spike is relevant to a spiking neuron circuit and each spike has an associated spatial coordinate corresponding to a location in an input spike array;
a transformation module configured to:
transform the kernel to produce a transformed kernel having an increased resolution relative to the kernel; and/or
transform the input spike array to produce a transformed input spike array having an increased resolution relative to the input spike array;
a packet collection module configured to collect spikes until a predetermined number of spikes relevant to the input spike array have been collected in a packet in memory, and to organize the collected relevant spikes in the packet based on the associated spatial coordinates of the collected relevant spikes; and
a convolutional neural processor configured to perform an event-based convolution using the memory and at least one of the transformed input spike array and the transformed kernel.

2. The system as claimed in claim 1, wherein the event-based convolution using the transformed input spike array produces a transposed convolved output.

3. The system as claimed in claim 2, wherein the transformation module is arranged to transform the input spike array by dilating the input spike array.

4. The system as claimed in claim 2, wherein the transformation module is arranged to transform the input spike array by padding the input spike array with zeros.

5. The system as claimed in claim 1, wherein the memory stores data representative of the transformed input spike arrays.

6. The system as claimed in claim 1, wherein the memory stores data representative of the input spike arrays and the transformation module is arranged to transform the input spike array after the input spike array is read from the memory.

7. The system as claimed in claim 1, wherein the event-based convolution using the transformed kernel produces a dilated convolved output.

8. The system as claimed in claim 7, wherein the transformation module is arranged to transform the kernel by dilating the kernel.

9. The system as claimed in claim 1, wherein the memory stores data representative of the transformed kernels.

10. The system as claimed in claim 1, wherein the memory stores data representative of the kernels and the transformation module is arranged to transform the kernel after the kernel is read from the memory.

11. The system as claimed in claim 1, wherein the data representative of at least one kernel is data representative of a 180° rotated kernel.

12. The system as claimed in claim 1, wherein:
the digital data is representative of an image; and
the convolutional neural processor is configured to apply a transformation function to an existing training image in order to simulate at least one further training image that is similar to the existing training image, and to perform network training based on the existing training image and the at least one further training image.

13. The system as claimed in claim 1, wherein the received spikes correspond to a plurality of channels, and the packet collection module is further configured to organize the collected relevant spikes by channel in the packet.

14. The system as claimed in claim 1, wherein the memory is further configured to store kernel weights indexed by channel.

15. The system as claimed in claim 1, comprising an inbound filter configured to select the collected relevant spikes for reception by the input module.

16. The system as claimed in claim 15, wherein the inbound filter is configured to remove the received spikes that are outside a scope of the convolution neural processor.

17. The system as claimed in claim 1, wherein the convolution neural processor is configured to implement the event-based convolution by:
identifying spike values in the input spike array or the transformed input spike array;
multiplying each element of the kernel or the transformed kernel by each identified spike value in the input spike array or the transformed input spike array;
calculating a potential using the multiplied elements and the spike values; and
using the potential to produce an output event.

18. A system, comprising:
a memory for storing data representative of at least one kernel;
a plurality of spiking neuron circuits;
an input module for receiving spikes related to an input image, wherein each spike is relevant to a spiking neuron circuit;
a transformation module configured to:
apply a transformation function to the received spikes in order to generate transformed spikes related to at least one further image that is similar to the input image, or
apply the transformation function to the spiking neuron circuits in order to simulate transformed neuron circuits, so that the transformed neuron circuits receive the spikes related to the input image; and
a convolutional neural processor to determine a convolution output for the at least one further image, the convolutional neural processor configured to perform an event-based convolution using the memory for storing data representative of the kernels and the received spikes.

19. The system as claimed in claim 18, wherein the convolutional neural processor, to determine the convolution output for the at least one further image, is configured to perform the event-based convolution using the memory for storing data representative of the kernels and at least one of:
the transformed spikes received by the spiking neuron circuits, and
the spikes received by the transformed neuron circuits.

20. The system as claimed in claim 18, wherein the further image is at least one of:

a flipped image of the input image; a rotated image of the input image; a sheared image of the input image; a translated image of the input image; and a masked image of the input image.

21. A method for performing event-based convolution, comprising:

storing in memory, data representative of at least one kernel;

receiving, by an input module, spikes related to digital data, wherein each spike is relevant to a spiking neuron circuit and each spike has an associated spatial coordinate corresponding to a location in an input spike array;

transforming, by a transformation module,
- a kernel to produce a transformed kernel having an increased resolution relative to the kernel; and/or
- the input spike array to produce a transformed input spike array having an increased resolution relative to the input spike array;

collecting, by a packet collection module, the spikes related to the digital data until a predetermined number of spikes relevant to the input spike array have been collected in a packet in memory, and to organize the collected relevant spikes in the packet based on the spatial coordinates of the spikes; and performing, by a convolution neural processor, the event-based convolution using the memory and at least one of the transformed input spike array and the transformed kernel.

\* \* \* \* \*

UNITED STATES PATENT AND TRADEMARK OFFICE
CERTIFICATE OF CORRECTION

PATENT NO. : 11,989,645 B2
APPLICATION NO. : 17/583640
DATED : May 21, 2024
INVENTOR(S) : McLelland et al.

It is certified that error appears in the above-identified patent and that said Letters Patent is hereby corrected as shown below:

In the Claims

In Column 37, Claim 21, Line 30, delete "array" and replace with --arrays--.

Signed and Sealed this
Seventeenth Day of September, 2024

Katherine Kelly Vidal
*Director of the United States Patent and Trademark Office*